United States Patent
Oh et al.

(10) Patent No.: US 9,831,407 B2
(45) Date of Patent: Nov. 28, 2017

(54) LIGHT EMITTING DEVICE PACKAGE, BACKLIGHT UNIT, ILLUMINATION APPARATUS, AND METHOD OF MANUFACTURING LIGHT EMITTING DEVICE PACKAGE

(71) Applicant: LUMENS CO., LTD., Yongin-si, Gyeonggi-do (KR)

(72) Inventors: Seung-Hyun Oh, Gwangju-si (KR); Sung-Sik Jo, Yongin-si (KR); Jung-A Lim, Seoul (KR); Sung-Yole Yun, Yongin-si (KR); Ji-Yeon Lee, Yongin-si (KR); Bo-Young Kim, Seoul (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/038,042

(22) PCT Filed: Nov. 20, 2014

(86) PCT No.: PCT/KR2014/011210
§ 371 (c)(1),
(2) Date: May 19, 2016

(87) PCT Pub. No.: WO2015/076591
PCT Pub. Date: May 28, 2015

(65) Prior Publication Data
US 2016/0300988 A1    Oct. 13, 2016

(30) Foreign Application Priority Data

Nov. 21, 2013  (KR) .................. 10-2013-0142035
Nov. 21, 2013  (KR) .................. 10-2013-0142036
Nov. 21, 2013  (KR) .................. 10-2013-0142038

(51) Int. Cl.
*H01L 33/00*    (2010.01)
*H01L 33/62*    (2010.01)
(Continued)

(52) U.S. Cl.
CPC .............. *H01L 33/62* (2013.01); *H01L 24/29* (2013.01); *H01L 24/32* (2013.01); *H01L 24/83* (2013.01);
(Continued)

(58) Field of Classification Search
CPC ....... H01L 33/60; H01L 33/62; H01L 33/486; H01L 33/54; H01L 33/46; H01L 33/56
See application file for complete search history.

(56) References Cited

U.S. PATENT DOCUMENTS 6,774,401 B2 *  8/2004  Nakada ................. H01L 33/405
                                                              257/81
7,923,831 B2 *  4/2011  Ng ........................ H01L 33/486
                                                              257/678
(Continued)

FOREIGN PATENT DOCUMENTS

JP    2004-006468 A    1/2004
JP    2007-184426      7/2007
(Continued)

OTHER PUBLICATIONS

International Search Report dated Feb. 27, 2015 in PCT/KR2014/011210, 4 pgs.
(Continued)

*Primary Examiner* — Ngan Ngo
(74) *Attorney, Agent, or Firm* — Ichthus International Law PLLC

(57) ABSTRACT

Disclosed herein are a light emitting device package, a backlight unit, an illumination apparatus, and a method of manufacturing a light emitting device package capable of being used for a display application or an illumination application. The light emitting device package includes: a flip-chip type light emitting device having a first terminal and a second terminal installed therebeneath; a substrate
(Continued)

having a first electrode formed at one side of an electrode separating space and a second electrode formed at the other side thereof; a first conductive bonding member installed on the first electrode of the substrate so as to be electrically connected to the first terminal of the light emitting device; a second conductive bonding member installed on the second electrode of the substrate so as to be electrically connected to the second terminal of the light emitting device; a reflection encapsulant molded and installed on the substrate so as to form a reflection cup part reflecting light generated in the light emitting device and filled in the electrode separating space to form an electrode separating part; and a filler filled between the reflection cup part and the first and second conductive bonding members.

15 Claims, 23 Drawing Sheets

(51) Int. Cl.
  *H01L 33/46* (2010.01)
  *H01L 33/48* (2010.01)
  *H01L 33/54* (2010.01)
  *H01L 33/60* (2010.01)
  *H01L 23/00* (2006.01)
  *H01L 33/50* (2010.01)
  *H01L 33/56* (2010.01)

(52) U.S. Cl.
  CPC ............ *H01L 33/46* (2013.01); *H01L 33/486* (2013.01); *H01L 33/50* (2013.01); *H01L 33/54* (2013.01); *H01L 33/56* (2013.01); *H01L 33/60* (2013.01); *H01L 24/30* (2013.01); *H01L 2224/27312* (2013.01); *H01L 2224/29015* (2013.01); *H01L 2224/29019* (2013.01); *H01L 2224/3015* (2013.01); *H01L 2224/32227* (2013.01); *H01L 2224/83193* (2013.01); *H01L 2224/83385* (2013.01); *H01L 2924/15156* (2013.01); *H01L 2933/0066* (2013.01)

(56) References Cited

U.S. PATENT DOCUMENTS

| | | | | |
|---|---|---|---|---|
| 8,319,242 B2* | 11/2012 | Shiobara | ................. | H01L 33/44 257/791 |
| 8,624,343 B2* | 1/2014 | Fuke | ....................... | C08K 3/22 257/100 |
| 8,735,933 B2* | 5/2014 | Lin | ......................... | H01L 33/62 257/100 |
| 8,846,420 B2* | 9/2014 | Shiobara | ............... | H01L 33/486 438/113 |
| 9,065,028 B2* | 6/2015 | Lin | ......................... | H01L 33/60 |
| 2007/0158674 A1* | 7/2007 | Taguchi | ................... | H01L 33/60 257/99 |
| 2008/0191227 A1* | 8/2008 | Kimura | .................. | H01L 33/62 257/98 |
| 2012/0205697 A1* | 8/2012 | Kim | ........................ | H01L 33/36 257/98 |
| 2013/0037840 A1* | 2/2013 | Onishi | .................... | H01L 33/60 257/98 |
| 2014/0117396 A1* | 5/2014 | Eisert | ....................... | H01L 33/44 257/98 |
| 2014/0120641 A1* | 5/2014 | Kim | ...................... | H01L 33/486 438/27 |
| 2014/0159069 A1* | 6/2014 | Tsai | ........................ | H01L 33/44 257/88 |
| 2015/0340566 A1* | 11/2015 | Butterworth | ........ | H01L 33/0079 257/98 |

FOREIGN PATENT DOCUMENTS

| | | |
|---|---|---|
| JP | 4176067 | 8/2008 |
| JP | 4996096 | 5/2012 |
| KR | 10-1995-0015673 A | 6/1995 |
| KR | 10-0426897 | 4/2004 |
| KR | 10-2007-0058298 A | 6/2007 |
| KR | 10-2011-0051982 A | 5/2011 |
| KR | 10-2012-0091839 A | 8/2012 |
| KR | 10-2013-0080299 A | 7/2013 |

OTHER PUBLICATIONS

Office Action dated Dec. 24, 2014 in Korean Patent Application No. 10-2013-0142035, 5 pgs.
Office Action dated Oct. 28, 2014 in Korean Patent Application No. 10-2013-0142038, 4 pgs.
Office Action dated Oct. 28, 2014 in Korean Patent Application No. 10-2013-0142036, 4 pgs.

* cited by examiner

LIGHT EMITTING DEVICE PACKAGE, BACKLIGHT UNIT, ILLUMINATION APPARATUS, AND METHOD OF MANUFACTURING LIGHT EMITTING DEVICE PACKAGE

CROSS-REFERENCE TO RELATED APPLICATION(S)

This application is a National Stage entry of International Application No. PCT/KR2014/011210, filed on Nov. 20, 2014, which claims priority to Korean Patent Application Nos. 10-2013-0142035, filed on Nov. 21, 2013, 10-2013-0142036, filed Nov. 21, 2013, and 10-2013-0142038, filed on Nov. 21, 2013, all the contents of which are incorporated herein by reference in their entirety.

TECHNICAL FIELD

The present invention relates to a light emitting device package, a backlight unit, an illumination apparatus, and a method of manufacturing a light emitting device package, and more particularly, a light emitting device package, a backlight unit, an illumination apparatus, and a method of manufacturing a light emitting device package capable of being used for a display application or an illumination application.

BACKGROUND ART

A light emitting diode (LED) indicates a kind of semiconductor device capable of implementing various colors of light by forming a PN diode using a compound semiconductor to configure a light emitting source. The LED has a long lifespan, may be miniaturized and become light, and may be driven at a low voltage. In addition, the LED is robust to impact and vibration, does not require a preheating time and complicated driving, and may be mounted in various shapes on a substrate or a lead frame and be then packaged, such that the LED may be modularized for several applications and be used in a backlight unit, various illumination apparatuses, or the like.

DISCLOSURE

Technical Problem

However, in a light emitting device package according to the related art, in the case in which a flip-chip type light emitting device is attached on a substrate, thermal stress is generated due to a difference between a coefficient of thermal expansion of the substrate and a coefficient of thermal expansion of an encapsulant caused by characteristics of the light emitting device package generally exposed to a high temperature environment for a long period of time, such that a crack is generated in the light emitting device or a bonding member is damaged.

In addition, in the light emitting device package according to the related art, a filler filled in a reflection cup part is not sufficiently filled in a space between the light emitting device and the substrate, such that air bubbles are formed, thereby significantly deteriorating performance of a product.

The present invention is to solve several problems including the problems as described above, and an object of the present invention is to provide a light emitting device package, a backlight unit, an illumination apparatus, and a method of manufacturing a light emitting device package in which a difference between a coefficient of thermal expansion of a light emitting device and a coefficient of thermal expansion of a substrate may be relatively low, thermal stress may be minimized by molding a reflection encapsulant that may form a reflection cup part and an electrode separating part and is formed of a white epoxy molding compound (EMC) material on the substrate, formation of air bubbles in a filler may be prevented using centrifugal force and step cure (a low viscosity section), and damage to the light emitting device and a bonding member due to the thermal stress may be prevented by improving a terminal structure of the light emitting device. However, this object is only an example, and the scope of the present invention is not limited thereto.

Technical Solution

According to an exemplary embodiment of the present invention, a light emitting device package may include: a flip-chip type light emitting device having a first terminal and a second terminal installed therebeneath; a substrate having a first electrode formed at one side of an electrode separating space and a second electrode formed at the other side thereof; a first conductive bonding member installed on the first electrode of the substrate so as to be electrically connected to the first terminal of the light emitting device; a second conductive bonding member installed on the second electrode of the substrate so as to be electrically connected to the second terminal of the light emitting device; a reflection encapsulant molded and installed on the substrate so as to form a reflection cup part reflecting light generated in the light emitting device and filled in the electrode separating space to form an electrode separating part; and a filler filled between the reflection cup part and the first and second conductive bonding members.

The reflection encapsulant may be formed of a white epoxy molding compound (EMC) or a silicon molding compound (SMC) corresponding to a thermosetting resin having a coefficient of thermal expansion that is in 80% of a coefficient of thermal expansion of the substrate.

The first conductive bonding member may be a first solder cream installed on the first electrode of the substrate so as to be electrically connected to the first terminal of the light emitting device and mixed with a liquid-phase solvent to have a dotting viscosity so as to be dotted by a dotting pin, and the second conductive bonding member may be a second solder cream installed on the second electrode of the substrate so as to be electrically connected to the second terminal of the light emitting device and mixed with a liquid-phase solvent to have a dotting viscosity so as to be dotted by a dotting pin.

The electrode separating part may have a height higher than that of the substrate.

The filler may be formed of one or more selected from the group consisting of at least silicon, transparent epoxy, a phosphor, and a combination thereof.

The filler may be filled between the first conductive bonding member and the second conductive bonding member by centrifugal force.

According to another exemplary embodiment of the present invention, a backlight unit may include: a flip-chip type light emitting device having a first terminal and a second terminal installed therebeneath; a substrate having a first electrode formed at one side of an electrode separating space and a second electrode formed at the other side thereof; a first conductive bonding member installed on the first electrode of the substrate so as to be electrically connected to the first terminal of the light emitting device; a second conductive bonding member installed on the second electrode of the substrate so as to be electrically connected to the second terminal of the light emitting device; a reflection encapsulant molded and installed on the substrate so as to form a reflection cup part reflecting light generated in the light emitting device and filled in the electrode separating space to form an electrode separating part; a filler filled between the reflection cup part and the first and second conductive bonding members; and a light guide plate installed in a light path of the light emitting device.

According to still another exemplary embodiment of the present invention, an illumination apparatus may include: a flip-chip type light emitting device having a first terminal and a second terminal installed therebeneath; a substrate having a first electrode formed at one side of an electrode separating space and a second electrode formed at the other side thereof; a first conductive bonding member installed on the first electrode of the substrate so as to be electrically connected to the first terminal of the light emitting device; a second conductive bonding member installed on the second electrode of the substrate so as to be electrically connected to the second terminal of the light emitting device; a reflection encapsulant molded and installed on the substrate so as to form a reflection cup part reflecting light generated in the light emitting device and filled in the electrode separating space to form an electrode separating part; and a filler filled between the reflection cup part and the first and second conductive bonding members.

According to yet still another exemplary embodiment of the present invention, a method of manufacturing a light emitting device package may include: preparing a substrate having a first electrode formed at one side of an electrode separating space and a second electrode formed at the other side thereof; molding a reflection encapsulant on the substrate, the reflection encapsulant forming a reflection cup part and filled in the electrode separating space to form an electrode separating part; bonding a first conductive bonding member to the first electrode of the substrate so as to be electrically connected to a first terminal of a flip-chip type light emitting device and bonding a second conductive bonding member to the second electrode of the substrate so as to be electrically connected to a second terminal of the light emitting device; seating the light emitting device on the substrate; allowing the substrate to reflow while being multi-stage-exhausted at a multi-step temperature so that the first conductive bonding member and the second conductive bonding member that are dotted are cured; and filling a filler in the reflection cup part.

The method of manufacturing a light emitting device package may further include, after the filling of the filler in the reflection cup part, applying centrifugal force to the filler by rotating the substrate so that the filler is filled between the first conductive bonding member and the second conductive bonding member.

The first terminal of the light emitting device may include: a reinforcing metal layer installed to be close to the light emitting device and formed of a conductive material having a first elongation percentage; and a buffering metal layer installed beneath the reinforcing metal layer and formed of a conductive material having a second elongation percentage higher than the first elongation percentage.

The reinforcing metal layer may be formed of one or more selected from the group consisting of at least silver (Ag), tin (Sn), aluminum (Al), and a combination thereof.

The buffering metal layer may contain pure gold (Au) having a thickness of 5000 Å or more.

The buffering metal layer may have a thermal stress alleviating protrusion formed thereon or a thermal stress alleviating groove part installed therein.

The buffering metal layer may have a thermal stress alleviating rugged surface formed thereon.

A plurality of first solder creams may be simultaneously dotted on a surface of the first electrode of the substrate.

The first solder cream may be installed in a solder cream accommodating groove part or a solder cream height limiting protrusion of the first electrode of the substrate.

The first solder cream may be installed on a solder cream accommodating rugged surface of the first electrode of the substrate.

Advantageous Effects

According to some exemplary embodiments of the present invention configured as described above, a structure and a material of the reflection encapsulant are improved, thereby making it possible to minimize the thermal stress, formation of the air bubbles in the filler may be prevented using the centrifugal force, a terminal structure of the light emitting device is improved, thereby making it possible to prevent damage to the light emitting device or the bonding member due to the thermal stress, and bonding of the flip chip is facilitated, thereby making it possible to improve the durability of the product and maximize the mass production property and the productivity of the flip-chip light emitting device product. The scope of the present invention is not limited to the above-mentioned effects.

BEST MODE

Figure 1:
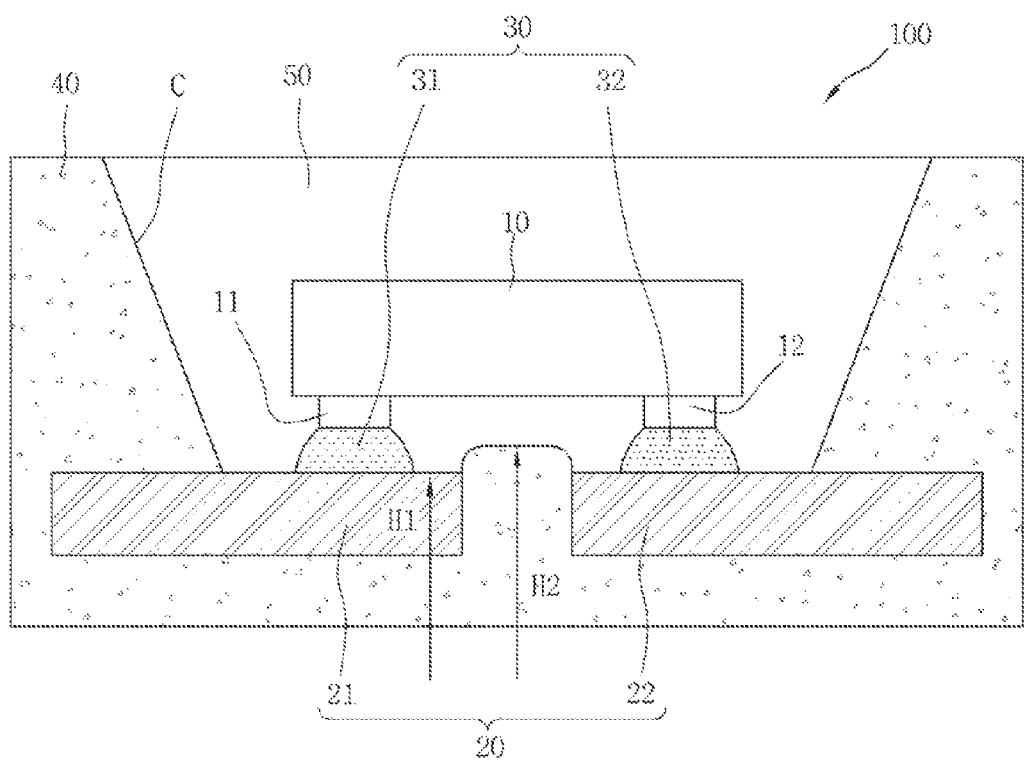
FIG. 1 is a cross-sectional view conceptually illustrating a light emitting device package according to some exemplary embodiments of the present invention.

Hereinafter, several exemplary embodiments of the present invention will be described in detail with reference to the accompanying drawings.

Exemplary embodiments of the present invention will be provided only in order to further completely describe the present invention to those skilled in the art, the following exemplary embodiments may be modified into other several forms, and the scope of the present invention is not limited to the following exemplary embodiments. Rather, these exemplary embodiments make the present disclosure thorough and complete, and are provided in order to completely transfer the spirit of the present invention to those skilled in the art. In addition, thicknesses or sizes of the respective layers in the drawings have been exaggerated for convenience and clarity of explanation.

Throughout the present disclosure, when it is mentioned that one component such as a film, a region, or a substrate is "positioned on", "connected to", "stacked on", or "coupled to" another component, it may be interpreted that one component is directly "positioned on", "connected to", "stacked on", or "coupled to" another component to contact another component or is "positioned on", "connected to", "stacked on", or "coupled to" another component with the other components interposed therebetween. On the other hand, when it is mentioned that one component is "directly positioned on", "directly connected to", or "directly coupled to" another component, it may be interpreted that one component is "positioned on", "connected to", or "coupled to" another component without the other components interposed therebetween. Like reference numerals denote like elements. As used in the present disclosure, a term "and/or" includes any one of corresponding enumerated items and all combinations of one or more of the corresponding enumerated items.

It is obvious that although terms such as "first", "second", and the like, are used in order to describe various members, components, regions, layers, and/or parts in the present disclosure, these members, components, regions, layers, and/or parts are not limited by these terms. These terms are used only in order to distinguish one member, component, region, layer, or part from another member, component, region, layer, or part. Therefore, a first member, a first component, a first region, a first layer, or a first part to be described below may indicate a second member, a second component, a second region, a second layer, or a second part without departing from the scope of the present invention.

In addition, relative terms such as "on" or "above" and "beneath" or "below" may be used herein in order to describe a relationship between any component and other components as illustrated in the accompanying drawings. It may be understood that the relative terms include other directions of devices in addition to directions illustrated in the accompanying drawings. For example, when devices are overturned in the accompanying drawings, components illustrated as being present on upper surfaces of other components have directions on lower surfaces of other components. Therefore, the term "on" mentioned by way of example may include both of directions of "beneath" and "on" depending on specific directions in the accompanying drawings. When devices are directed toward other directions (rotation by 90 degrees with respect to other directions), relative descriptions used in the present disclosure may be interpreted accordingly.

Terms used in the present disclosure are used in order to describe a specific exemplary embodiment, are not to limit the present invention. As used in the present disclosure, a singular form may include plural forms unless explicitly described otherwise. In addition, terms "comprise" and/or "comprising" used in the present disclosure specify the presence of stated shape, numerals, steps, operations, members, elements, and/or a group thereof, but do not preclude the presence or the addition of one or more other shapes, numerals, steps, operations, members, elements, or groups thereof.

Hereinafter, exemplary embodiments of the present invention will be described with reference to the accompanying drawings schematically illustrating ideal exemplary embodiments of the present invention. In the accompanying drawings, for example, modification of illustrated shapes may be expected depending on a manufacturing technology and/or a tolerance. Therefore, an exemplary embodiment of the spirit of the present invention is not to be interpreted as being limited to specific shapes of regions illustrated in the present disclosure, but should include changes of shapes caused in, for example, a manufacturing process.

Figure 5:
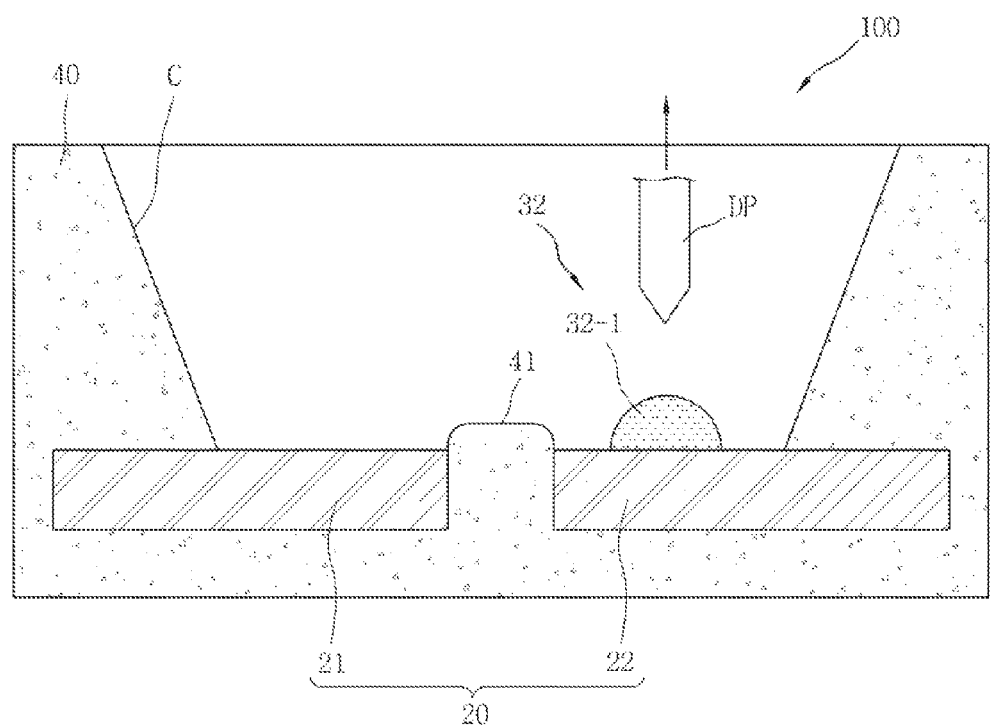
Figure 6:
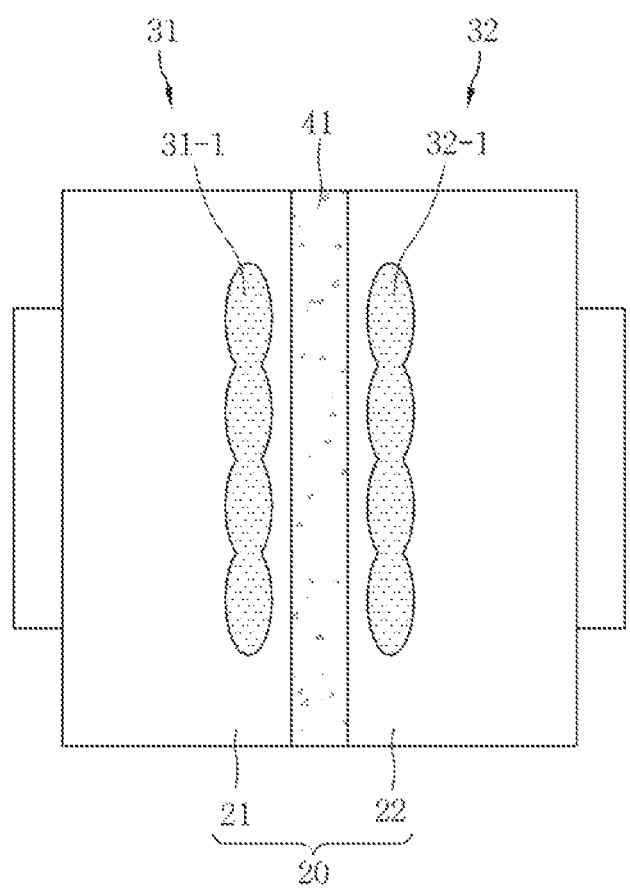
FIG. 6 is a perspective view illustrating a dotting pin of FIG. 3.
Figure 7:
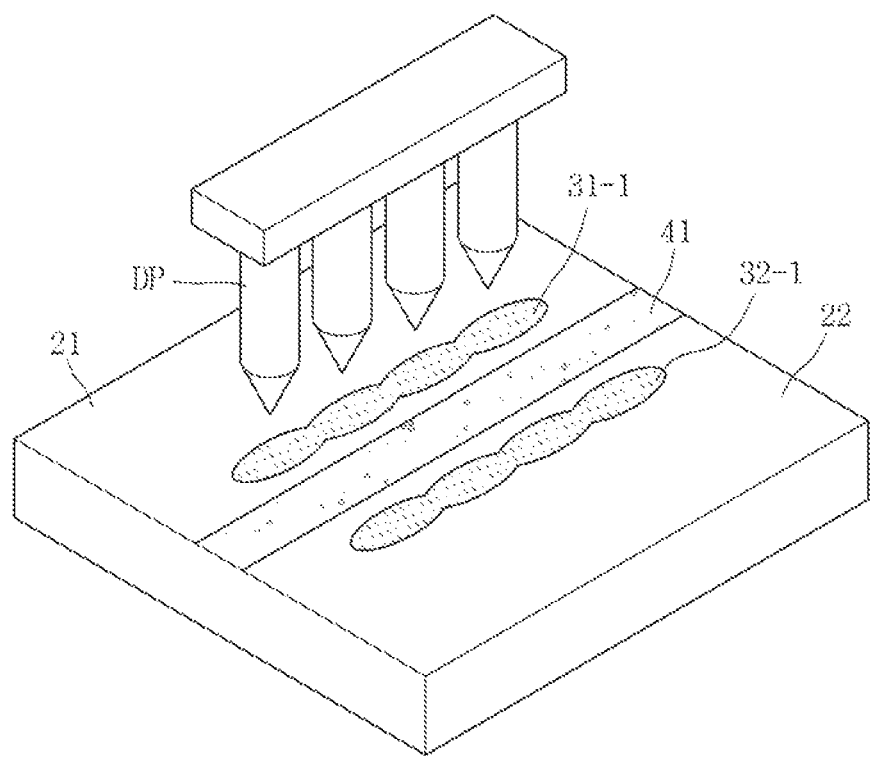
FIG. 7 is a plan view illustrating a substrate of the light emitting device package of FIG. 3.
Figure 8:
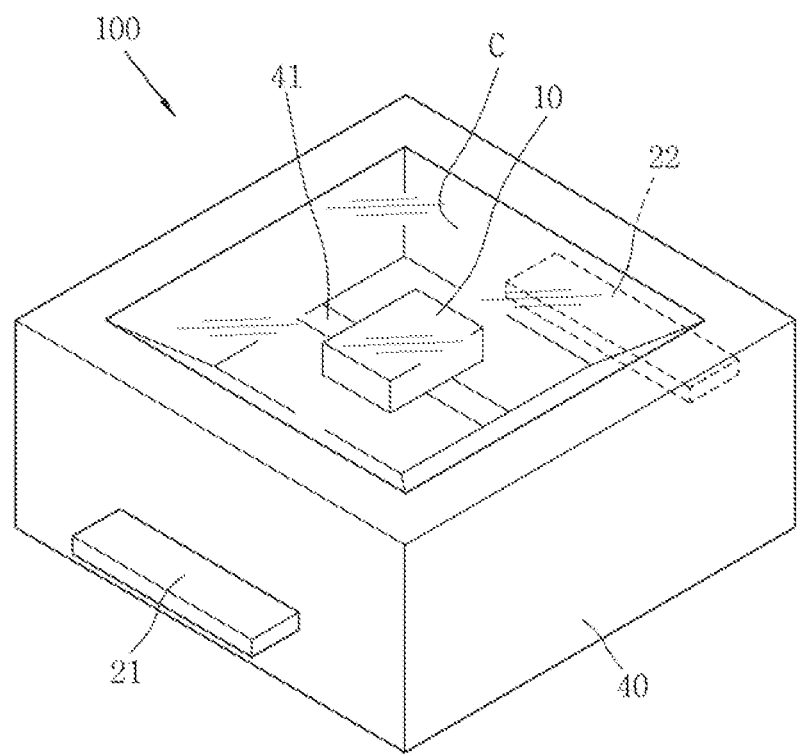
FIG. 8 is a perspective view of the light emitting device package of FIG. 1.

FIG. 1 is a cross-sectional view conceptually illustrating a light emitting device package 100 according to some exemplary embodiments of the present invention. In addition, FIGS. 2 to 5 are cross-sectional views illustrating steps of an installation process of a first solder cream 31-1 and a second solder cream 32-1 of the light emitting device package 100 of FIG. 1, FIG. 6 is a perspective view illustrating a dotting pin DP of FIG. 3, FIG. 7 is a plan view illustrating a substrate 20 of the light emitting device package 100 of FIG. 3, and FIG. 8 is a perspective view of the light emitting device package of FIG. 1.

First, as illustrated in FIGS. 1 to 8, the light emitting device package 100 according to some exemplary embodiments of the present invention may mainly include a light emitting device 10, a substrate 20, a bonding member 30, a reflection encapsulant 40, and a filler 50.

Here, the light emitting device 10 may be a flip-chip type light emitting diode (LED) having a first terminal 11 and a second terminal 12 installed on a lower surface thereof, as illustrated in FIG. 1.

The light emitting device 10 may be formed of a semiconductor, as illustrated in FIGS. 1 to 8. For example, light emitting diodes (LEDs) formed of a nitride semiconductor and emitting blue light, green light, red light, and yellow light, an LED formed of a nitride semiconductor and emitting ultraviolet light, or the like, may be used.

In addition, the light emitting device 10 may be configured by epitaxially growing a nitride semiconductor such as InN, AlN, InGaN, AlGaN, InGaAlN, and the like, on a sapphire substrate or a silicon carbide substrate for growth by a vapor growth method such as a metal organic chemical vapor deposition (MOCVD) method, or the like. In addition, the light emitting device 10 may be formed using semiconductors such as ZnO, ZnS, ZnSe, SiC, GaP, GaAlAs, AlInGaP, and the like, in addition to the nitride semiconductor. As these semiconductors, laminates in which an n-type semiconductor layer, a light emitting layer, and a p-type semiconductor layer are sequentially stacked may be used. As the light emitting layer (active layer), a multilayer semiconductor having a multi-quantum well structure or a single quantum well structure or a multilayer semiconductor having a double hetero structure may be used. In addition, as the light emitting device 10, a light emitting device having any wavelength may be selected according to an application such as a display application, an illumination application, or the like.

Here, as the substrate for growth, an insulating substrate, a conductive substrate, or a semiconductor substrate may be used as needed. For example, the substrate for growth may be formed of sapphire, SiC, Si, $MgAl_2O_4$, MgO, $LiAlO_2$, $LiGaO_2$, or GaN. A GaN substrate, which is a homogeneous substrate, is preferable in order to epitaxially grow a GaN material. However, it is difficult to manufacture the GaN substrate, such that a production cost of the GaN substrate is high.

As a heterogeneous substrate, a sapphire substrate, a silicon carbide (SiC) substrate, or the like, has been mainly used, and the sapphire substrate has been mainly used as compared with the silicon carbide substrate which is expensive. When using the heterogeneous substrate, a defect such as a dislocation, or the like, is increased due to a difference in a lattice constant between a substrate material and a thin film material. In addition, warpage is generated at the time of changing a temperature due to a difference in a coefficient of thermal expansion between the substrate material and the thin film material. The warpage causes a crack of a thin film. This problem may be reduced using a buffer layer between the substrate and a light emitting laminate formed of a GaN based material.

In addition, the substrate for growth may also be completely or partially removed or patterned in a chip manufacturing process in order to improve optical or electrical characteristics of an LED chip before or after growth of an LED structure.

For example, in the case of the sapphire substrate, a laser beam is irradiated to an interface between the sapphire substrate and a semiconductor layer through the sapphire substrate, thereby making it possible to separate the sapphire substrate from the semiconductor layer, and the silicon or silicon carbide substrate may be removed by a method such as a polishing/etching method, or the like.

In addition, another support substrate may be used at the time of removing the substrate for growth. In this case, the support substrate may be bonded to an opposite side to an original growth substrate using a reflecting metal or a reflection structure may be inserted in the middle of a bonding layer, in order to improve light efficiency of the LED chip at an opposite side to an original substrate for growth.

Further, patterning of the substrate for growth forms a rugged or inclined surface before or after growth of the LED structure on main surfaces (surfaces or both surfaces) or side surfaces of the substrate, thereby improving light extraction efficiency. Patterns may have sizes that may be selected in a range of 5 nm to 500 μm, may be regular or irregular, and may have any structure for improving the light extraction efficiency. The patterns may have various shapes such as a pillar shape, a mountain shape, a hemispherical shape, a polygonal shape, and the like.

The sapphire substrate, which is a crystal body having Hexa-Rhombo (R3c) symmetry, has lattice constants of 13.001 and 4.758 in c-axis and a-axis directions, and has a C plane, an A plane, an R plane, and the like. In this case, a nitride thin film is relatively easily grown on the C plane and the C plane is stable at a high temperature. Therefore, the C plane is mainly used as a substrate for growing nitride.

In addition, another example of the substrate for growth may be a Si substrate. The Si substrate is more appropriate for increasing a diameter and is relatively cheap, such that a mass production property may be improved.

In addition, the silicon (Si) substrate absorbs light generated in a GaN based semiconductor, such that external quantum efficiency of the light emitting device is reduced. Therefore, the Si substrate is removed, and a support substrate such as a Si substrate, a Ge substrate, a SiAl substrate, a ceramic substrate, a metal substrate, or the like, including a reflecting layer is additionally formed and used, if necessary.

When a GaN thin film is grown on a heterogeneous substrate such as the Si substrate, a dislocation density is increased due to discordance between lattice constants of a substrate material and a thin film material, and a crack and warpage may be generated due to a difference between coefficients of thermal expansion of the substrate material and the thin film material. In order to prevent a dislocation and a crack of a light emitting laminate, a buffer layer may be disposed between the substrate for growth and the light emitting laminate. The buffer layer serves to adjust a warpage level of the substrate at the time of growing an active layer, thereby reducing wavelength distribution of a wafer.

In addition, although not illustrated, the light emitting device 10 may be a flip-chip type light emitting device having a signal transfer medium such as a bump, a pad, a solder, or the like. Further, all of light emitting devices in which bonding wires are applied to both of the first terminal and the second terminal or are applied to only the first terminal or the second terminal, such as a horizontal type light emitting device, a vertical type light emitting device, and the like, may be applied.

In addition, one light emitting device 10 may be installed on the substrate 20, as illustrated in FIG. 1, or a plurality of light emitting devices 20 may be installed on the substrate 20.

Meanwhile, the substrate 20 may include, for example, a lead frame having a first electrode 21 formed at one side of an electrode separating space and a second electrode 22 formed at the other side thereof, as illustrated in FIG. 1.

The substrate 20 may be formed of a material having appropriate mechanical strength and an insulating property so as to support the light emitting device 10 or a conductive material.

For example, as the substrate 20, a metal substrate formed of aluminum, copper, zinc, tin, lead, gold, silver, or the like, that is insulation-processed may be used, and substrates having a plate form or a lead frame form may be used.

In addition, the substrate 20 may be a printed circuit board (PCB) in which a plurality of epoxy based resin sheets are formed. Further, the substrate 20 may be a flexible printed circuit board (FPCB) formed of a flexible material.

In addition, as the substrate 20, a synthetic resin substrate formed of a resin, glass epoxy, or the like, may be used or a ceramic substrate may be used in consideration of thermal conductivity.

Further, the substrate 20 may be partially or entirely formed of one or more selected from the group consisting of at least an epoxy molding compound (EMC), polyimide (PI), ceramic, graphene, glass synthetic fiber, and combinations thereof in order to improve workability.

Meanwhile, the bonding member 30 may serve to electrically connect the light emitting device 10 and the substrate 20 to each other.

For example, as illustrated in FIGS. 1 to 8, the bonding member 30 may include a first conductive bonding member 31 and a second conductive bonding member 32.

That is, the first conductive bonding member 31 may be a bonding member installed on the first electrode 21 of the substrate 20 so as to be electrically connected to the first terminal 11 of the light emitting device 10.

In addition, the second conductive bonding member 32 may be a bonding member installed on the second electrode 22 of the substrate 20 so as to be electrically connected to the second terminal 12 of the light emitting device 10.

In more detail, for example, as illustrated in FIGS. 2 to 5, the first conductive bonding member 31 may be a first solder cream 31-1 installed on the first electrode 21 of the substrate 20 so as to be electrically connected to the first terminal 11 of the light emitting device 10 and mixed with a liquid-phase solvent to have a dotting viscosity so as to be dotted by a dotting pin DP.

In addition, as illustrated in FIGS. 2 to 5, the second conductive bonding member 32 may be a second solder cream 32-1 installed on the second electrode 22 of the substrate 20 so as to be electrically connected to the second terminal 12 of the light emitting device 10 and mixed with a liquid-phase solvent to have a dotting viscosity so as to be dotted by a dotting pin DP.

Figure 2:
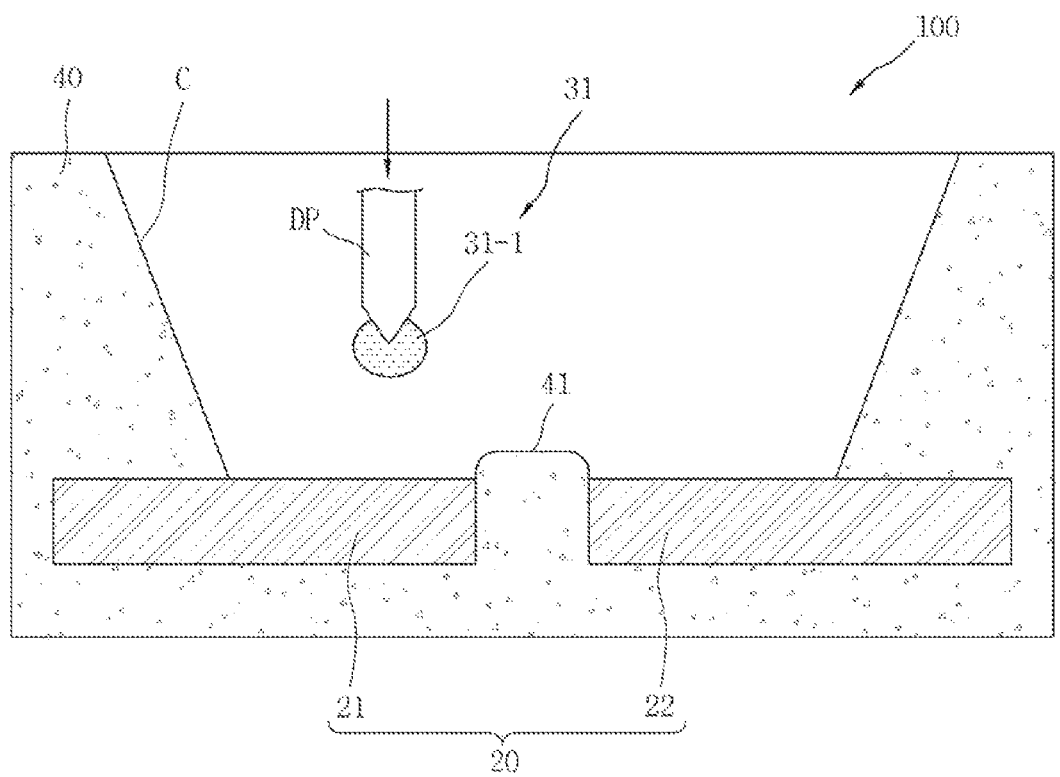
FIGS. 2 to 5 are cross-sectional views illustrating steps of an installation process of a first solder cream and a second solder cream of the light emitting device package of FIG. 1.
Figure 3:
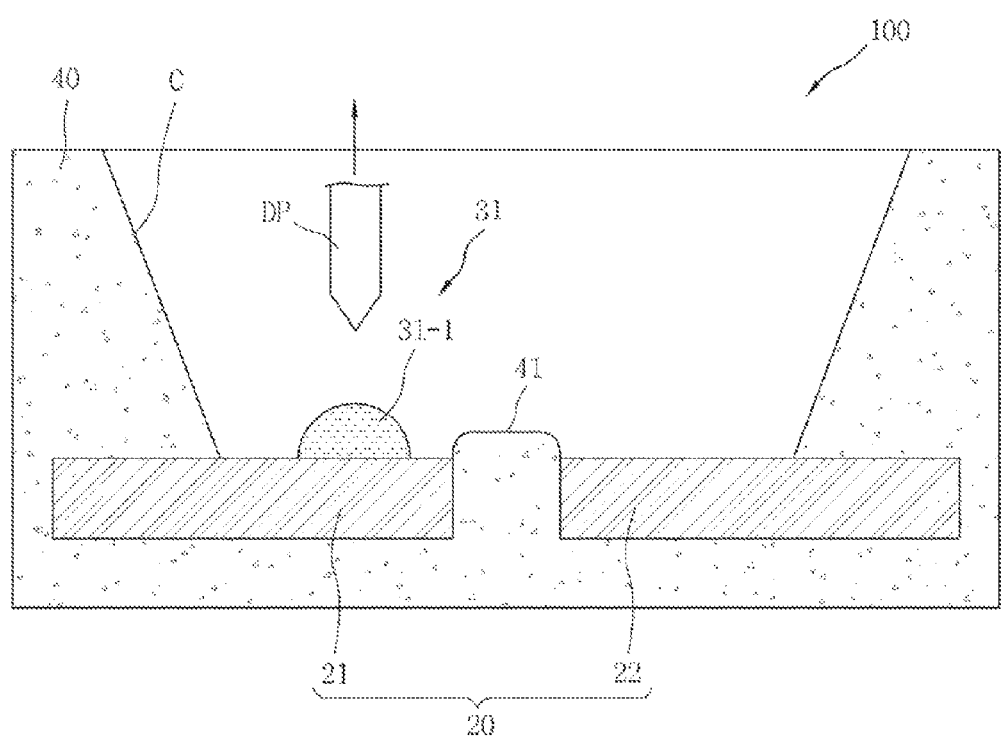

Therefore, first, the dotting pins DP are dipped into a solder cream accommodated in a dotting liquid accommodating container (not illustrated) to form the first solder creams 31-1 having a droplet form at the front ends of the dotting pins, as illustrated in FIG. 2. Then, when the first solder creams 31-1 are arranged at an accurate position of substrate 20, the dotting pins DP descend to dot the first solder creams 31-1 stuck to the front ends of the dotting pins DP on the substrate 20, as illustrated in FIG. 3.

Here, as illustrated in FIG. 6, a plurality of first solder creams 31-1 may be simultaneously dotted on a surface of the first electrode 21 of the substrate 20, and the first solder creams 31-1 that are dotted may be formed to be attached and connected to each other. Alternatively, the first solder creams 31-1 are not attached to each other, but may also be formed to be spaced apart from each other.

Figure 4:
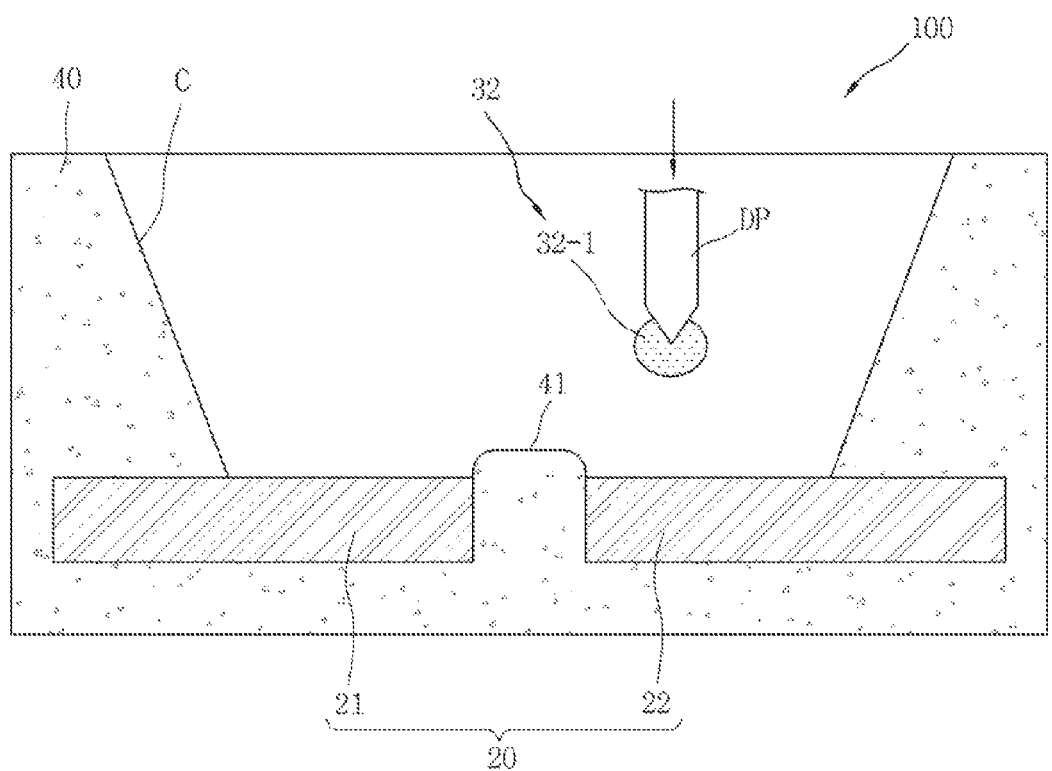

Then, the dotting pins DP are dipped into the solder cream accommodated in the dotting liquid accommodating container (not illustrated) to form the second solder creams 32-1 having a droplet form at the front ends of the dotting pins, as illustrated in FIG. 4. Then, when the second solder creams 32-1 are arranged at an accurate position of the substrate 20, the dotting pins DP descend to dot the second solder creams 32-1 stuck to the front ends of the dotting pins DP on the substrate 20, as illustrated in FIG. 5.

Here, a plurality of second solder creams 32-1 may also be simultaneously dotted on a surface of the second electrode 22 of the substrate 20.

In addition, the first solder creams 31-1 and the second solder creams 32-1 may also be simultaneously dotted.

A method of dotting the solder creams on the substrate 20 using these ultra-precision dotting pins DP is called an ultra-transfer method or an ultra-precision stamping method, and the solder creams may be applied onto the substrate 20 by various printing methods such as an inkjet printing method, a stencil printing method, a squeeze printing method, and the like.

Meanwhile, the reflection encapsulant 40 may be a molded product molded and installed on the substrate 20 so as to form a reflection cup part C reflecting light generated in the light emitting device 10 and filled in the electrode separating space to form an electrode separating part 41.

Here, the reflection encapsulant 40 may be formed of a thermosetting resin having a coefficient of thermal expansion that is in 80% of a coefficient of thermal expansion of the first and second electrodes 21 and 22 of the substrate 20, for example, a white EMC or a silicon molding compound (SMC).

That is, when the coefficient of thermal expansion of the first and second electrodes 21 and 22 of the substrate is approximately 10 ppm/° C., a coefficient of thermal expansion of conventional resins is approximately 50 ppm/° C., such that a component was damaged due to excessive thermal stress caused by a large difference between the coefficients of thermal expansion, but a coefficient of thermal expansion of the white EMC is at most 30 ppm/° C., and experimentally, when a difference from the coefficient of thermal expansion of the first and second electrodes 21 and of the substrate 20 is in 80%, thermal stress is minimized, thereby making it possible to prevent damage to the component.

In addition, the reflection encapsulant 40 forms the electrode separating part, as described above, and the electrode separating part 41 may have a height H2 higher than a height H1 of the substrate 20, as illustrated in FIG. 1. Therefore, the electrode separating part 41 may form a separation wall between the first solder creams 31-1 and the second solder creams 32-1 to prevent a defect such as a short-circuit and serve to guide the first solder creams 31-1 and the second solder creams 32-1 to accurate positions, at the time of dotting the first solder creams 31-1 and the second solder creams 32-1. However, a shape of the reflection encapsulant 40 may be variously changed. For example, two heights H1 and H2 may be the same as a height of the substrate 20.

In addition, the reflection encapsulant 40 may be formed of one or more selected from the group consisting of an epoxy resin composition, a silicon resin composition, a modified epoxy resin composition, a modified silicon resin composition, a polyimide resin composition, a modified polyimide resin composition, polyphthalamide (PPA), a polycarbonate resin, polyphenylene sulfide (PPS), a liquid crystal polymer (LCP), an ABS resin, a phenol resin, an acrylic resin, and a PBT resin, a Bragg reflection layer, an air gap, a total reflection layer, a metal layer, and a combination thereof.

Further, the reflection encapsulant 40 may be formed of one or more selected from the group consisting of at least an EMC containing a reflecting material, white silicon containing a reflecting material, a photo-imageable solder resist (PSR), and a combination thereof.

Further, in more detail, the reflection encapsulant 40 may be formed of a resin, for example, a silicon resin composition, a modified epoxy resin composition such as a silicon-modified epoxy resin, or the like, a modified silicon resin composition such as an epoxy-modified silicon resin, or the like, a polyimide resin composition, a modified polyimide resin composition, polyphthalamide (PPA), a polycarbonate resin, polyphenylene sulfide (PPS), a liquid crystal polymer (LCP), an ABS resin, a phenol resin, an acrylic resin, a PBT resin, or the like.

Further, these resins may contain a light reflective material such as titanium oxide, silicon dioxide, titanium dioxide, zirconium dioxide, titanium potassium, alumina, aluminum nitride, boron nitride, mullite, chromium, a white based or metal based component, or the like.

Meanwhile, the filler 50, which is a material filled between the reflection cup part C and the first and second conductive bonding members 31 and 32, may be dispensed or applied onto the reflection cup part C.

Here, the filler 50 may be formed of one or more selected from the group consisting of at least silicon, transparent epoxy, a phosphor, and a combination thereof, which are materials having a relatively small particle size and being dense, so as to be filled between the light emitting device 10 and the substrate 20.

In addition, the filler 50 may include a phosphor.

A combination of the phosphor needs to basically conform with stoichiometry, and the respective elements may be replaced by other elements in the respective groups in a periodic table. For example, Sr may be replaced by Ba, Ca, Mg, or the like, in an alkaline earth (II) group, and Y may be replaced by Tb, Lu, Sc, Gd, or the like, in a lanthanide. In addition, Eu, or the like, which is an activator, may be replaced by Ce, Tb, Pr, Er, Yb, or the like, depending on a desired energy level, and the activator may be used singly or a sub-activator, or the like, may be additionally used in order to change characteristics.

In addition, materials such as a quantum dot, and the like, may be used as a material substituting for the phosphor, and a mixture of the phosphor and the quantum dot may be used or the phosphor or the quantum dot may be singly used in the LED.

The quantum dot may be configured in a structure of a core (3 to 10 nm) of CdSe, InP, or the like, a shell (0.5 to 2 nm) and a core of ZnS, ZnSe, or the like, and a ligand for stabilization of the shell, and may implement various colors depending on a size thereof.

In addition, as a method of applying the phosphor or the quantum dot, at least one of a method of spraying the phosphor or the quantum dot to the LED chip or the light emitting device, a method of covering the LED chip or the light emitting device in a film form, and a method of attaching a sheet form of a film, a ceramic phosphor, or the like, may be used.

The method of spraying the phosphor or the quantum dot generally is a dispensing method, a spray coating method, or the like, and the dispensing method includes a pneumatic method and a mechanical method such as a screw, a linear type, or the like. A dotting amount is controlled through discharging a small amount by a jetting method, thereby making it possible to control a color coordinate. A method of applying the phosphor en bloc onto a wafer level or the substrate of the light emitting device by a spray method may easily control productivity and a thickness.

As the method of covering the LED chip or the light emitting device in the film form, an electrophoresis method, a screen printing method, or a method of molding the phosphor may be used. These methods may have a difference depending on whether or not the phosphor is applied onto side surfaces of the LED chip.

In order to control efficiency of a long wavelength light emitting phosphor resorbing light emitted at a short wavelength, of two kinds or more of phosphors having different light emitting wavelengths, the two kinds or more of phosphors having the different light emitting wavelengths may be distinguished from each other, and a DBR (ODR) layer may be included between the respective layers in order to minimize wavelength resorption and interference of the LED chip and the two kinds or more of phosphors.

In order to form a uniform coating film, the phosphor may be manufactured in a film or ceramic form and be then attached onto the LED chip or the light emitting device.

In order to generate a difference in optical efficiency and light distribution characteristics, a light converting material may be positioned in a remote form. In this case, the light converting material is positioned together with translucent polymer, glass, or the like, depending on durability and heat resistance.

Since a technology of applying the phosphor plays the largest role in determining optical characteristics in the light emitting device, various studies on control technologies of a thickness of a phosphor applied layer, uniform dispersion of the phosphor, and the like, have been conducted. The quantum dot may also be positioned in the LED chip or the light emitting device, similar to the phosphor, and be positioned between glass or translucent polymer materials to perform light conversion.

Figure 9:
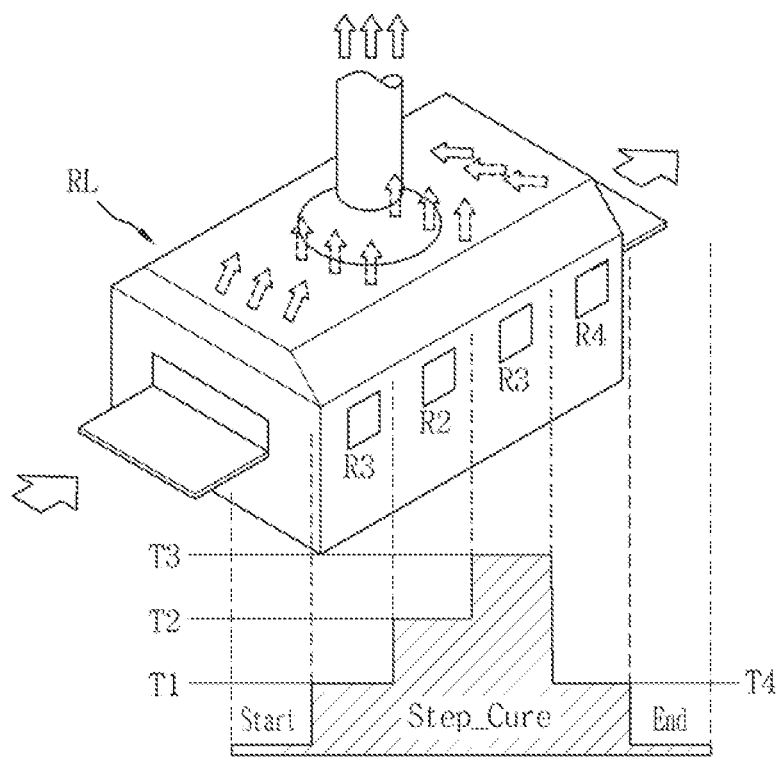
FIG. 9 is a perspective view illustrating an example of a reflow process of the light emitting device package of FIG. 1.

FIG. 9 is a perspective view illustrating an example of a reflow process of the light emitting device package 100 of FIG. 1.

As illustrated in FIG. 9, the light emitting device package 100 of FIG. 1 may use a reflow apparatus RL that may remove fumes while controlling a temperature at a multi-stage so as to prevent foreign materials such as fluxes, the fumes, or the like, that may be generated in the solder cream, or the like, described above in a reflow process from polluting the substrate.

For example, a plurality of processing chambers R1 to R4 in each step may be installed in the reflow apparatus RL. Here, the processing chambers R1 to R4 may be successively installed so that the light emitting device package 100 or strips may be transferred in line or may be partitioned from each other by a partition, a separation wall, an air curtain, or the like, so that temperature environments of the processing chambers R1 to R4 are discriminated from each other.

The processing chambers R1 to R4 may stepwise heat or cool the light emitting device package 100 or strips transferred in line while maintaining a first temperature T1, a second temperature T2, a third temperature T3, and a fourth temperature T4 in each section using heaters that are individually controlled, as illustrated in a temperature graph of FIG. 9.

In more detail, as illustrated in FIG. 9, the second temperature T2 may be higher than the first temperature T1, the third temperature T3 may be higher than the second temperature, and the fourth temperature T4 may be the same as the first temperature T1.

Therefore, the fumes, or the like, exhausted from the light emitting device package 100 or strips are exhausted to the outside along exhausting lines at a multi-stage, such that pollution of the substrate by the foreign materials such as the fluxes, the fumes, or the like, may be prevented. As a result, a separate cleaning process may not be required.

Figure 10:
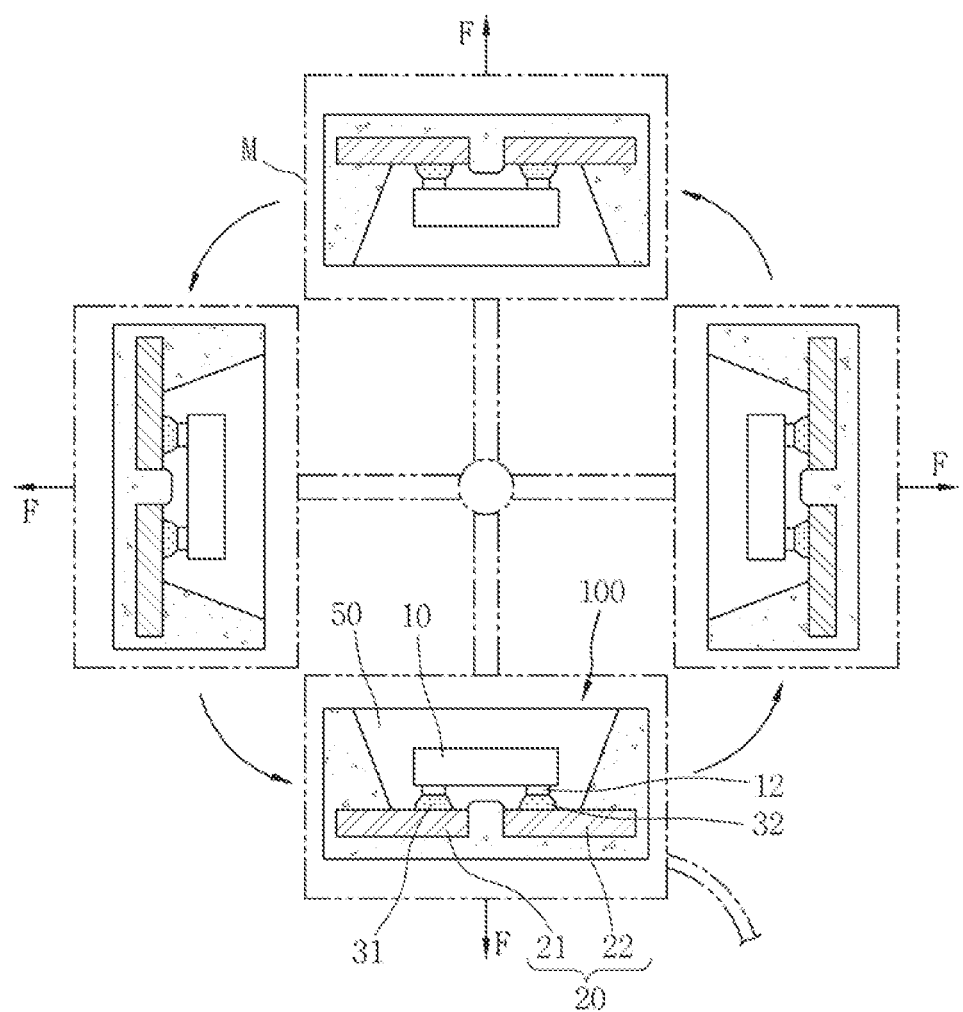
FIG. 10 is a plan view illustrating an example of a filler filling process of the light emitting device package of FIG. 1.

FIG. 10 is a plan view illustrating an example of a filler filling process of the light emitting device package 100 of FIG. 1.

As illustrated in FIG. 10, the filler 50 may be filled between the first conductive bonding member 31 and the second conductive bonding member 32 by centrifugal force F of a centrifugal pressurizer M. Here, the centrifugal pressurizer M may include a separate gas exhausting apparatus installed therein so as to exhaust the fumes, or the like, generated in the filler to the outside.

Figure 11:
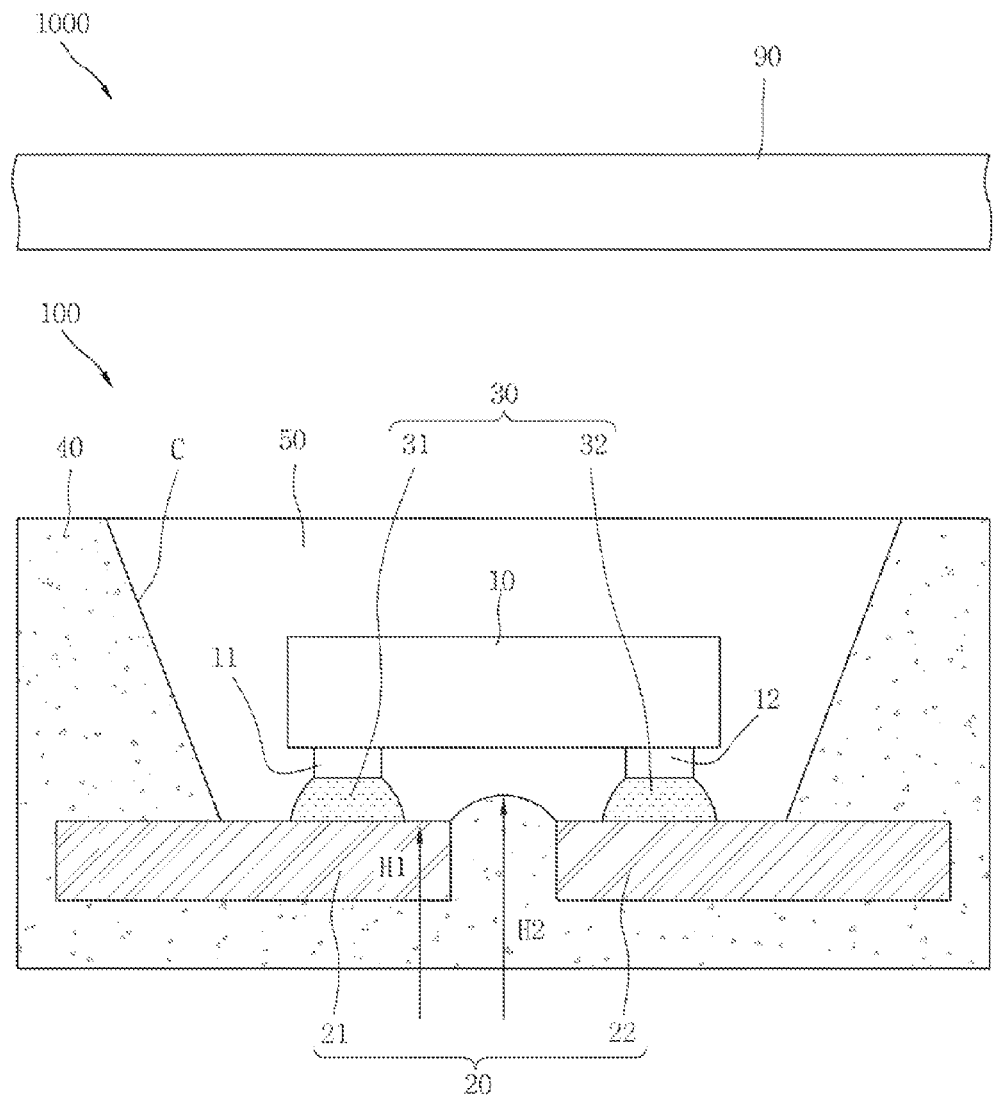
FIG. 11 is a cross-sectional view conceptually illustrating a backlight unit according to some exemplary embodiments of the present invention.

FIG. 11 is a cross-sectional view conceptually illustrating a backlight unit 1000 according to some exemplary embodiments of the present invention.

As illustrated in FIG. 11, the backlight unit 1000 according to some exemplary embodiments of the present invention may include a flip-chip type light emitting device 10 having a first terminal 11 and a second terminal installed therebeneath, a substrate 20 having a first electrode 21 formed at one side of an electrode separating space and a second electrode 22 formed at the other side thereof, a first conductive bonding member 31 installed on the first electrode 21 of the substrate 20 so as to be electrically connected to the first terminal 11 of the light emitting device 10, a second conductive bonding member 32 installed on the second electrode 22 of the substrate 20 so as to be electrically connected to the second terminal 12 of the light emitting device 10, a reflection encapsulant 40 molded and installed on the substrate 20 so as to form a reflection cup part C reflecting light generated in the light emitting device 10 and filled in the electrode separating space to form an electrode separating part 41, a filler 50 filled between the reflection cup part C and the first and second conductive bonding members 31 and 32, and a light guide plate 90 installed in a light path of the light emitting device 10.

Here, roles and configurations of the light emitting device 10, the substrate 20, the first conductive bonding member 31, the second conductive bonding member 32, the reflection encapsulant 40, and the filler 50 may be the same as those of the corresponding components of the light emitting device package 100 according to some exemplary embodiments of the present invention described above, as illustrated in FIG. 1. Therefore, a detailed description for these components will be omitted.

In addition, the light guide plate 90 may be an optical member that may be formed of a translucent material so as to guide the light generated in the light emitting device 10.

The light guide plate 90 may be installed in a path of the light generated in the light emitting device 10, and transfer the light generated in the light emitting device 10 to a wider area.

The light guide plate 90 may be formed of a material such as a polycarbonate based material, a polysulfone based material, a polyacrylate based material, a polystyrene based material, a polyvinylchloride based material, a polyvinyl alcohol based material, a poly-norbornene based material, polyester, or the like. In addition, the light guide plate 90 may be formed of various translucent resin based materials. Further, the light guide plate 90 may be formed by various methods such as a method of forming micro patterns, micro protrusions, a diffusion film, or the like, on a surface thereof, a method of forming micro air bubbles therein.

Here, although not illustrated, various diffusion sheets, a prism sheet, a filter, and the like, may be additionally installed above the light guide plate 90. In addition, various display panels such as a liquid crystal display (LCD) panel, and the like, may be installed above the light guide plate 90.

Meanwhile, although not illustrated, the present invention may include an illumination apparatus including the light emitting device package 100 described above. Here, configurations and roles of components of the illumination apparatus according to some exemplary embodiments of the present invention may be the same as those of the corresponding components of the light emitting device package according to the present invention described above. Therefore, a detailed description for these components will be omitted.

Figure 12:
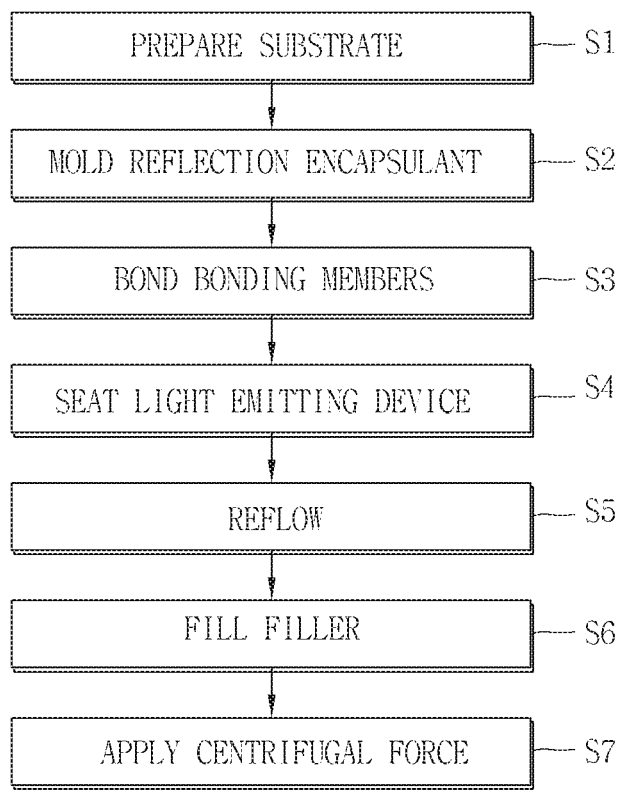
FIG. 12 is a flow chart illustrating a method of manufacturing a light emitting device package according to some exemplary embodiments of the present invention.

FIG. 12 is a flow chart illustrating a method of manufacturing a light emitting device package according to some exemplary embodiments of the present invention.

As illustrated in FIG. 12, the method of manufacturing a light emitting device package according to some exemplary embodiments of the present invention may include preparing a substrate 20 having a first electrode 21 formed at one side of an electrode separating space and a second electrode 22 formed at the other side thereof (S1), molding a reflection encapsulant 40 on the substrate 20 (S2), the reflection encapsulant 40 forming a reflection cup part C and filled in the electrode separating space to form an electrode separating part 41, bonding a first conductive bonding member 31 to the first electrode 21 of the substrate 20 so as to be electrically connected to a first terminal 11 of a flip-chip type light emitting device 10 and bonding a second conductive bonding member 32 to the second electrode 22 of the substrate 20 so as to be electrically connected to a second terminal 12 of the light emitting device 10 (S3), seating the light emitting device 10 on the substrate 20 (S4), allowing the substrate 20 to reflow at a multi-stage so that the first conductive bonding member 31 and the second conductive bonding member 32 that are bonded are cured (S5), filling a filler 50 in the reflection cup part C (S6), and applying centrifugal force to the filler 50 by rotating the substrate 20 so that the filler 50 is filled between the first conductive bonding member 31 and the second conductive bonding member 32.

Figure 13:
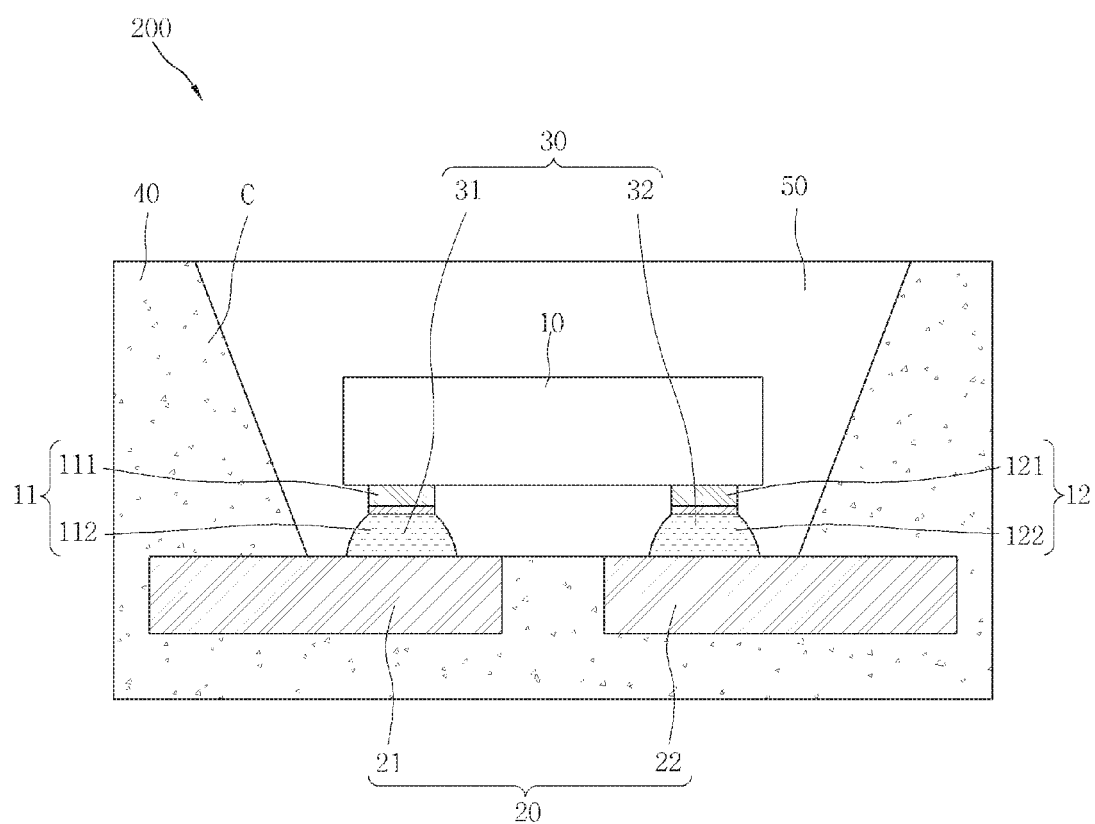
FIG. 13 is a cross-sectional view conceptually illustrating a light emitting device package according to some other exemplary embodiments of the present invention.

FIG. 13 is a cross-sectional view conceptually illustrating a light emitting device package 200 according to some exemplary embodiments of the present invention. In addition, FIG. 14 is an enlarged cross-sectional view illustrating a first terminal 11 of a light emitting device 10 of the light emitting device package 200 of FIG. 13.

Figure 14:
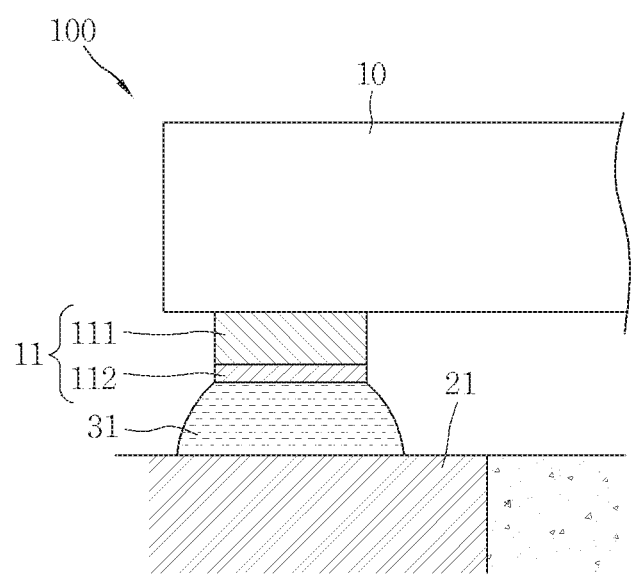
FIG. 14 is an enlarged cross-sectional view illustrating a first terminal of a light emitting device of the light emitting device package of FIG. 13.

First, as illustrated in FIGS. 13 and 14, the light emitting device package 200 according to some exemplary embodiments of the present invention may mainly include a light emitting device 10, a substrate 20, a bonding member 30, and a reflection encapsulant 40.

Here, roles and configurations of the light emitting device 10, the substrate 20, the bonding member 30, and the reflection encapsulant 40 may be the same as those of the corresponding components of the light emitting device package 100 according to some exemplary embodiments of the present invention described above, as illustrated in FIGS. 1 to 14. Therefore, a detailed description for these components will be omitted.

Meanwhile, the bonding member 30 may serve to electrically connect the light emitting device 10 and the substrate 20 to each other.

For example, as illustrated in FIGS. 1 and 2, the bonding member 30 may include a first conductive bonding member 31 and a second conductive bonding member 32.

That is, the first conductive bonding member 31 may be a bonding member installed on the first electrode 21 of the substrate 20 so as to be electrically connected to the first terminal 11 of the light emitting device 10.

In addition, the second conductive bonding member 32 may be a bonding member installed on the second electrode 22 of the substrate 20 so as to be electrically connected to the second terminal 12 of the light emitting device 10.

Figure 18:
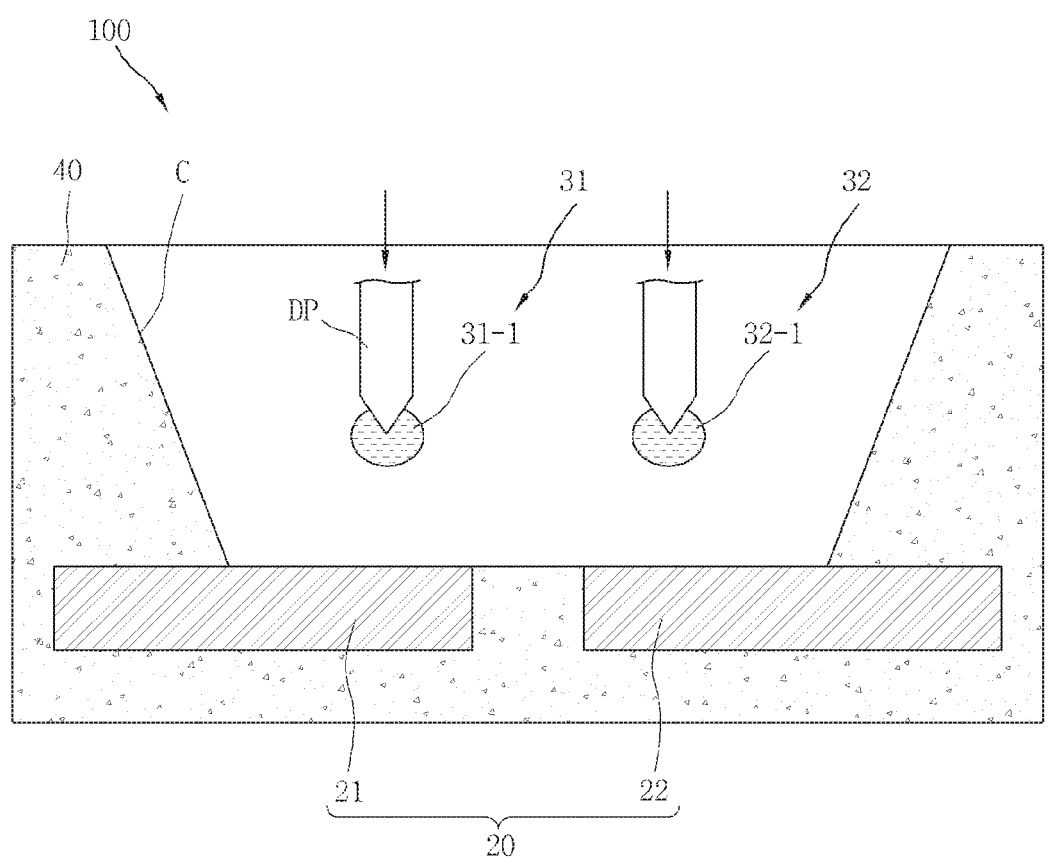
FIGS. 18 to 19 are cross-sectional views illustrating steps of an installation process of a first solder cream and a second solder cream of the light emitting device package of FIG. 13.
Figure 19:
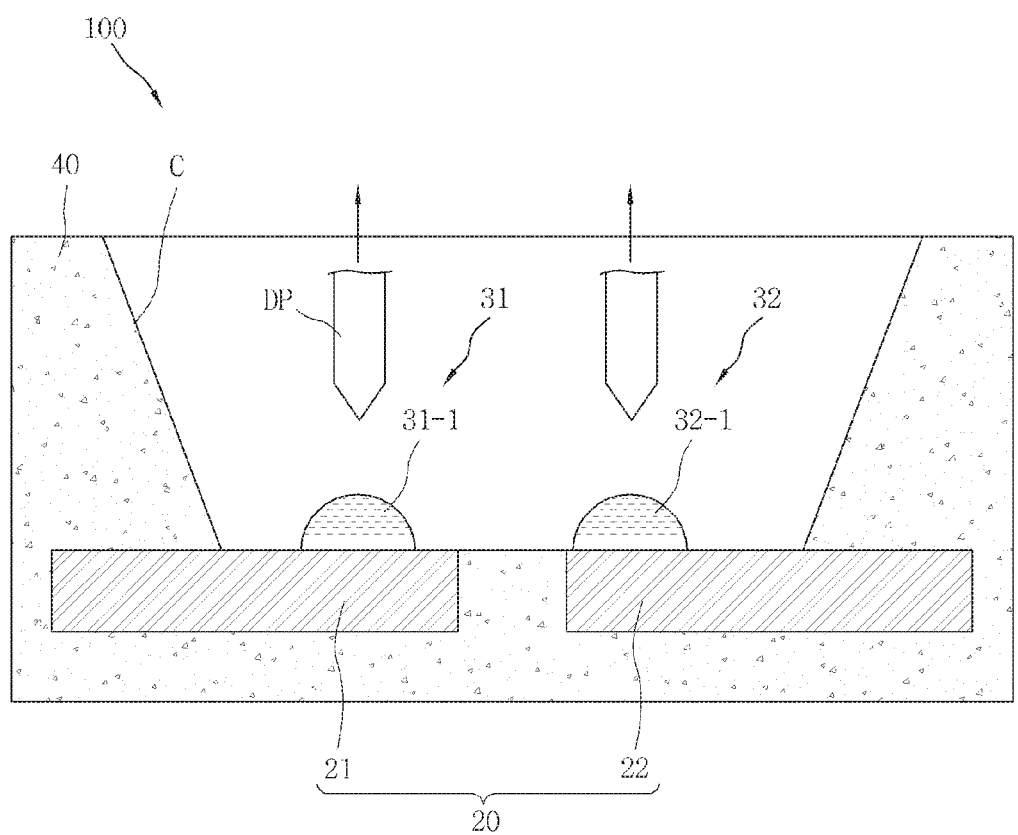

In more detail, for example, as illustrated in FIGS. 18 and 19, the first conductive bonding member 31 may be a first solder cream 31-1 installed on the first electrode 21 of the substrate 20 so as to be electrically connected to the first terminal 11 of the light emitting device 10 and mixed with a liquid-phase solvent to have a dotting viscosity so as to be dotted by a dotting pin DP. In addition, the first solder cream 31-1 may be precisely discharged through a dispenser, or the like.

In addition, as illustrated in FIGS. 18 and 19, the second conductive bonding member 32 may be a second solder cream 32-1 installed on the second electrode 22 of the substrate 20 so as to be electrically connected to the second terminal 12 of the light emitting device 10 and mixed with a liquid-phase solvent to have a dotting viscosity so as to be dotted by a dotting pin DP. In addition, the second solder cream 32-1 may be precisely discharged through a dispenser, or the like.

Therefore, first, the dotting pins DP are dipped into a solder cream accommodated in a dotting liquid accommodating container (not illustrated) to form the first solder creams 31-1 and the second solder creams 32-1 having a droplet form at the front ends of the dotting pins, as illustrated in FIG. 18. Then, when the first solder creams 31-1 are arranged at an accurate position of the substrate 20, the dotting pins DP descend to dot the first solder creams 31-1 and the second solder creams 32-1 stuck to the front ends of the dotting pins DP on the substrate 20, as illustrated in FIG. 19.

A method of dotting the solder creams on the substrate 20 using these ultra-precision dotting pins DP is called an ultra-precision stamping method, and the solder creams may be applied onto the substrate 20 by various printing methods such as an inkjet printing method, a stencil printing method, a squeeze printing method, and the like.

Meanwhile, as illustrated in FIG. 14, the first terminal 11 and the second terminal 12 of the light emitting device 10 may have a double-layer structure.

That is, the first terminal 11 of the light emitting device 10 may include a reinforcing metal layer 111 installed to be close to the light emitting device 10 and formed of a conductive material having a first elongation percentage and a buffering metal layer 112 installed beneath the reinforcing metal layer 111 and formed of a conductive material having a second elongation percentage higher than the first elongation percentage.

In addition, the second terminal 12 of the light emitting device 10 may include a reinforcing metal layer 121 installed to be close to the light emitting device 10 and formed of a conductive material having the first elongation percentage and a buffering metal layer 122 installed beneath the reinforcing metal layer 121 and formed of a conductive material having the second elongation percentage higher than the first elongation percentage.

In more detail, for example, the reinforcing metal layer 111 may be formed of one or more selected from the group consisting of at least silver (Ag), tin (Sn), aluminum (Al), and a combination thereof, and the buffering metal layer 112 may contain pure gold (Au) stacked beneath the reinforcing metal layer 111 by a method such as a plating method, a depositing method, a heat fusing method, or the like, and having a thickness of 5000 Å or more.

Here, the pure gold may have a purity of 99% or more, and a thickness of the pure gold should be experimentally 5000 Å or more in order to satisfy various tests such as an organization test, a durability test, and the like, by sufficiently alleviating thermal stress using an elongation percentage of the pure gold.

Therefore, even though thermal stress is generated between the light emitting device 10 and the substrate 20 due to a difference between coefficients of thermal expansion of the light emitting device 10 and the substrate 20, the buffering metal layer 112 formed of the pure gold having a high elongation percentage alleviates the thermal stress, thereby making it possible to prevent damage to a component. In addition, a thickness of the buffering metal layer 112 is reinforced, thereby making it possible to prevent a phenomenon that a crack is generated in the light emitting device 10.

Figure 15:
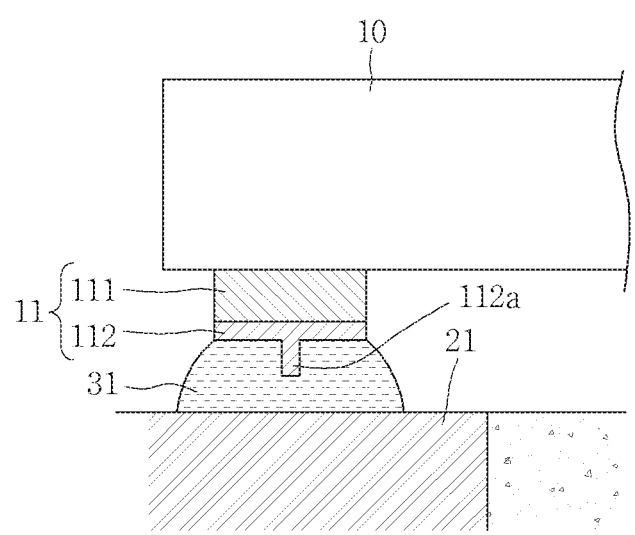
FIG. 15 is an enlarged cross-sectional view illustrating a first terminal of a light emitting device according to another example of FIG. 14.

FIG. 15 is an enlarged cross-sectional view illustrating a first terminal 11 of a light emitting device according to another example of FIG. 14.

As illustrated in FIG. 15, the buffering metal layer 112 of the first terminal 11 of the light emitting device according to another example may have a thermal stress alleviating protrusion 112a installed on one surface thereof in a thickness direction in order to alleviate thermal stress in the thickness direction as well as thermal stress in a length direction.

Therefore, even though thermal stress in the thickness direction is generated between the light emitting device 10 and the substrate 20 due to the difference between the coefficients of thermal expansion of the light emitting device 10 and the substrate 20, the thermal stress alleviating protrusion 112a alleviates the thermal stress in the thickness direction, thereby making it possible to prevent damage to a component.

Figure 16:
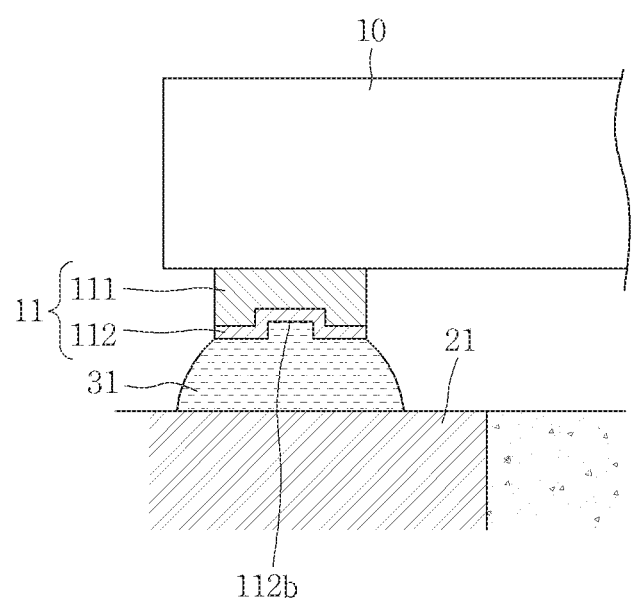
FIG. 16 is an enlarged cross-sectional view illustrating a first terminal of a light emitting device according to still another example of FIG. 14.

FIG. 16 is an enlarged cross-sectional view illustrating a first terminal 11 of a light emitting device according to still another example of FIG. 14.

As illustrated in FIG. 16, the buffering metal layer 112 of the first terminal 11 of the light emitting device according to still another example may have a thermal stress alleviating groove part 112b installed in one surface thereof in the thickness direction in order to alleviate thermal stress in the thickness direction as well as thermal stress in the length direction.

Therefore, even though thermal stress in the length and thickness directions is generated between the light emitting device 10 and the substrate 20 due to the difference between the coefficients of thermal expansion of the light emitting device 10 and the substrate 20, the thermal stress alleviating groove part 112b alleviates the thermal stress in the length and thickness directions, thereby making it possible to prevent damage to a component.

Figure 17:
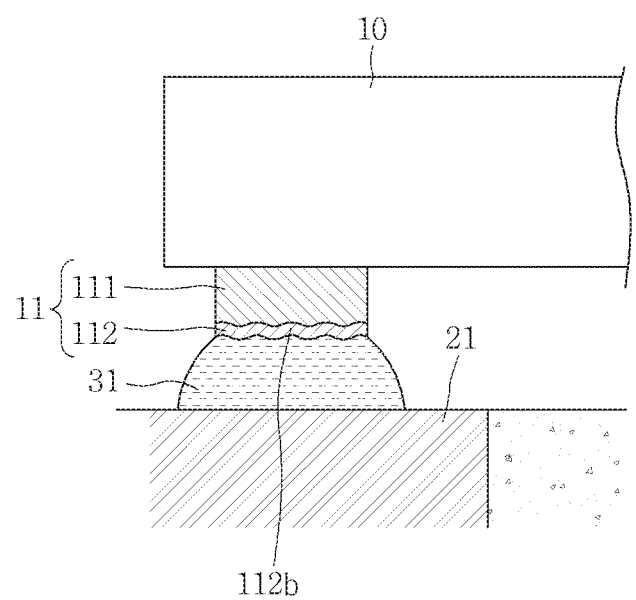
FIG. 17 is an enlarged cross-sectional view illustrating a first terminal of a light emitting device according to yet still another example of FIG. 14.

FIG. 17 is an enlarged cross-sectional view illustrating a first terminal 11 of a light emitting device according to yet still another example of FIG. 14.

As illustrated in FIG. 17, the buffering metal layer 112 of the first terminal 11 of the light emitting device according to yet still another example may have a thermal stress alleviating rugged surface 112c installed on one surface thereof in order to alleviate thermal stress in the thickness direction as well as thermal stress in the length direction and prevent delamination.

Therefore, even though thermal stress in the length and thickness directions is generated between the light emitting device 10 and the substrate 20 due to the difference between the coefficients of thermal expansion of the light emitting device 10 and the substrate 20, the thermal stress alleviating rugged surface 112c alleviates the thermal stress in the length and thickness directions and prevents interlayer delamination, thereby making it possible to prevent damage to a component and improve durability.

Figure 20:
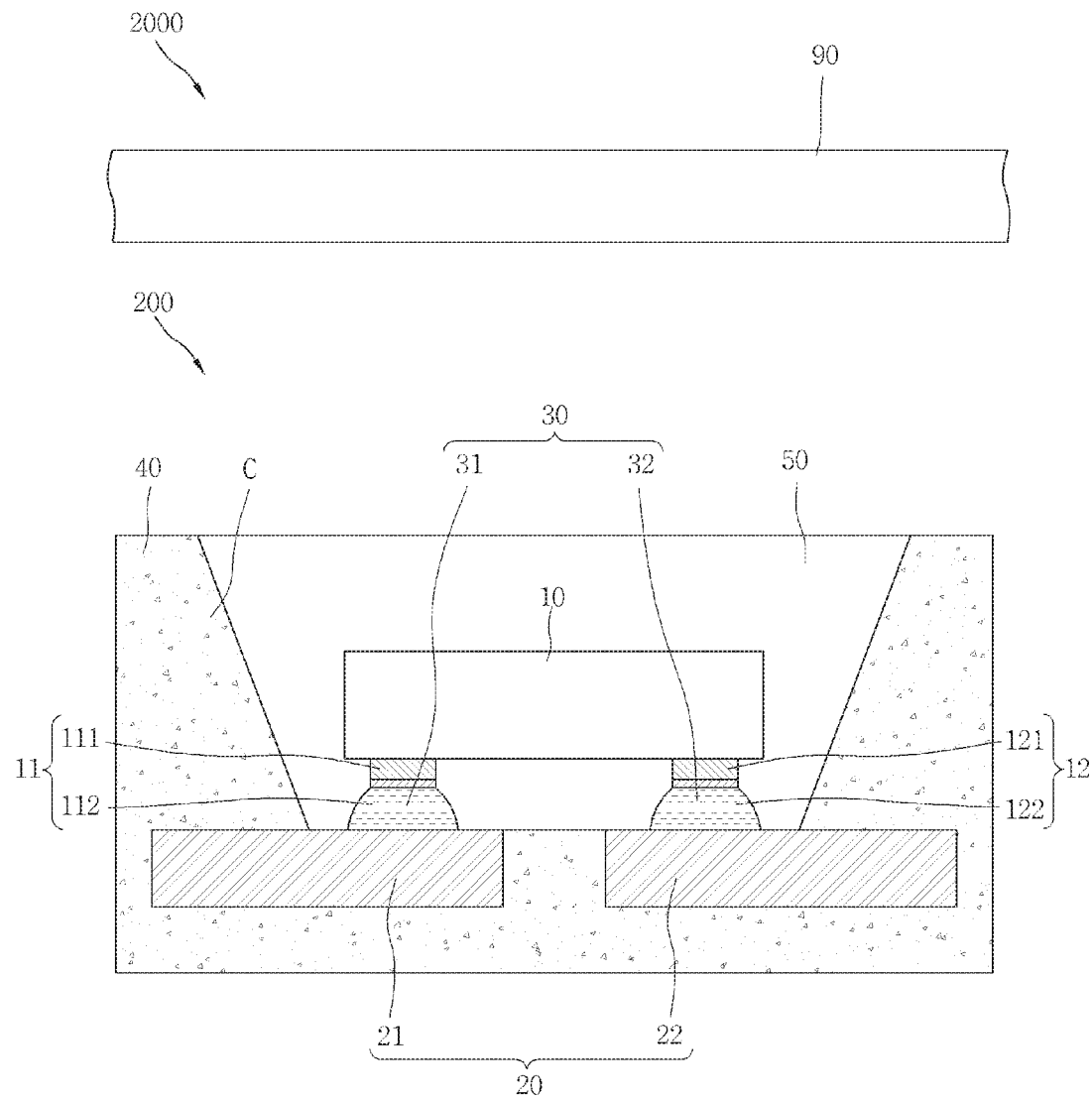
FIG. 20 is a cross-sectional view conceptually illustrating a backlight unit according to some other exemplary embodiments of the present invention.

FIG. 20 is a cross-sectional view conceptually illustrating a backlight unit 2000 according to some exemplary embodiments of the present invention.

As illustrated in FIG. 20, the backlight unit 2000 according to some exemplary embodiments of the present invention may include a flip-chip type light emitting device 10 having a first terminal 11 and a second terminal installed therebeneath, a substrate 20 having a first electrode 21 formed at one side of an electrode separating space and a second electrode 22 formed at the other side thereof, a first conductive bonding member 31 installed on the first electrode 21 of the substrate 20 so as to be electrically connected to the first terminal 11 of the light emitting device 10, a second conductive bonding member 32 installed on the second electrode 22 of the substrate 20 so as to be electrically connected to the second terminal 12 of the light emitting device 10, and a light guide plate 90 installed in a light path of the light emitting device 10, wherein the first terminal 11 of the light emitting device 10 includes a reinforcing metal layer 111 installed to be close to the light emitting device 10 and formed of a conductive material having a first elongation percentage and a buffering metal layer 112 installed beneath the reinforcing metal layer 111 and formed of a conductive material having a second elongation percentage higher than the first elongation percentage.

Here, roles and configurations of the light emitting device 10, the substrate 20, the first conductive bonding member 31, the second conductive bonding member 32, the reinforcing metal layer 111, the buffering metal layer 112, and the light guide plate 90 may be the same as those of the corresponding components of the light emitting device package 200 according to some exemplary embodiments of the present invention described above, as illustrated in FIGS. 1 to 14. Therefore, a detailed description for these components will be omitted.

Meanwhile, although not illustrated, the present invention may include an illumination apparatus or a display apparatus including the light emitting device package 200 described above. Here, configurations and roles of components of the illumination apparatus or the display apparatus according to some exemplary embodiments of the present invention may be the same as those of the corresponding components of the light emitting device package according to the present invention described above. Therefore, a detailed description for these components will be omitted.

Figure 21:
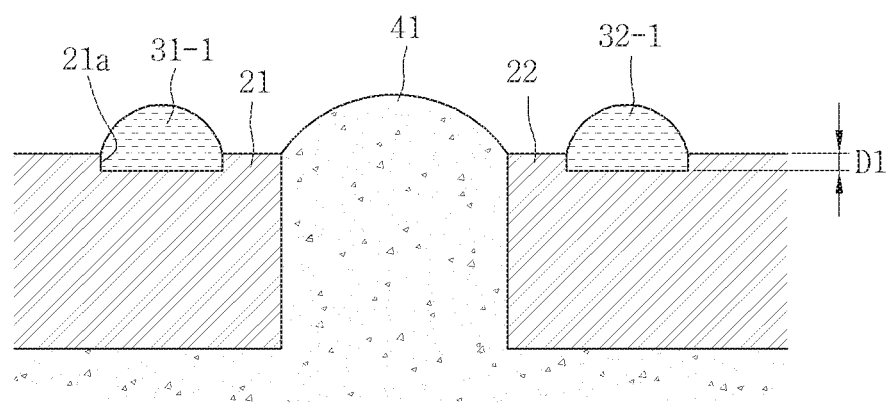
FIG. 21 is an enlarged cross-sectional view illustrating a substrate according to another example of FIG. 1.

FIG. 21 is an enlarged cross-sectional view illustrating a substrate 20 according to another example of FIG. 1.

As illustrated in FIG. 21, the substrate 20 according to another example may have solder cream accommodating groove parts 21a formed therein.

The solder cream accommodating groove parts 21a may be formed in the first electrode 21 of the substrate 20 so as to have a depression depth D1 by an equipment such as a cutter, a press, an etching apparatus, a laser apparatus, or the like.

That is, the first solder creams 31-1 may be installed in the solder cream accommodating groove parts 21a of the first electrode 21 of the substrate, such that they may be easily guided and seated at accurate positions without deviating from the solder cream accommodating groove parts 21a or in a state in which they slightly deviate from the solder cream accommodating groove parts 21a.

Figure 22:
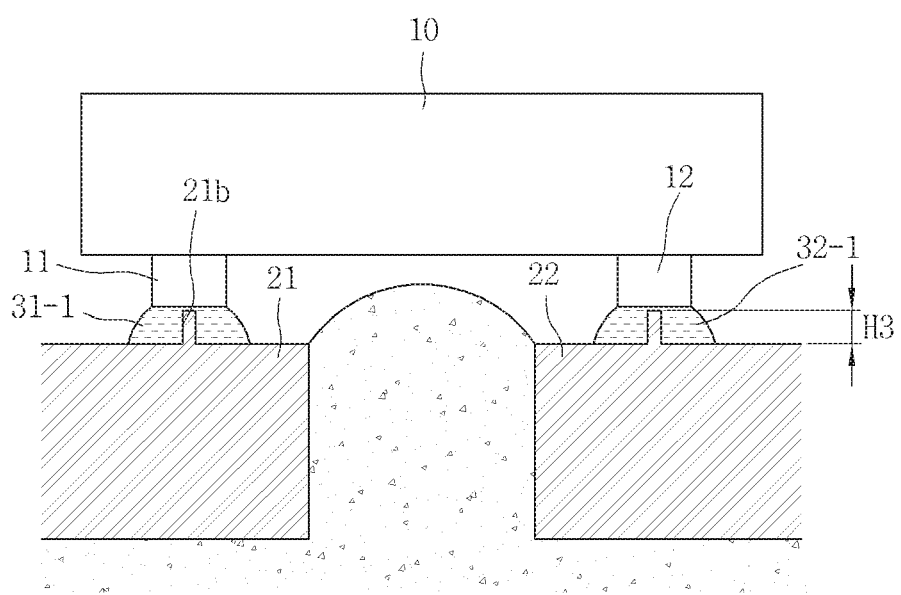
FIG. 22 is an enlarged cross-sectional view illustrating a substrate according to another example of FIG. 1.

FIG. 22 is an enlarged cross-sectional view illustrating a substrate 20 according to still another example of FIG. 1.

As illustrated in FIG. 22, the substrate 20 according to still another example may have solder cream height limiting protrusions 21b installed thereon.

The solder cream height limiting protrusions 21b may be formed on the first electrode 21 of the substrate 20 so as to have a protrusion height H3 by an equipment such as a cutter, a press, an etching apparatus, a laser apparatus, or the like.

That is, the first solder creams 31-1 may be installed in the solder cream height limiting protrusions 21b of the first electrode 21 of the substrate and be maintained at a predetermined height, such that they may not become excessively flat and may be seated at accurate positions without deviating from the solder cream height limiting protrusions 21b or in a state in which they slightly deviate from the solder cream height limiting protrusions 21b.

Figure 23:
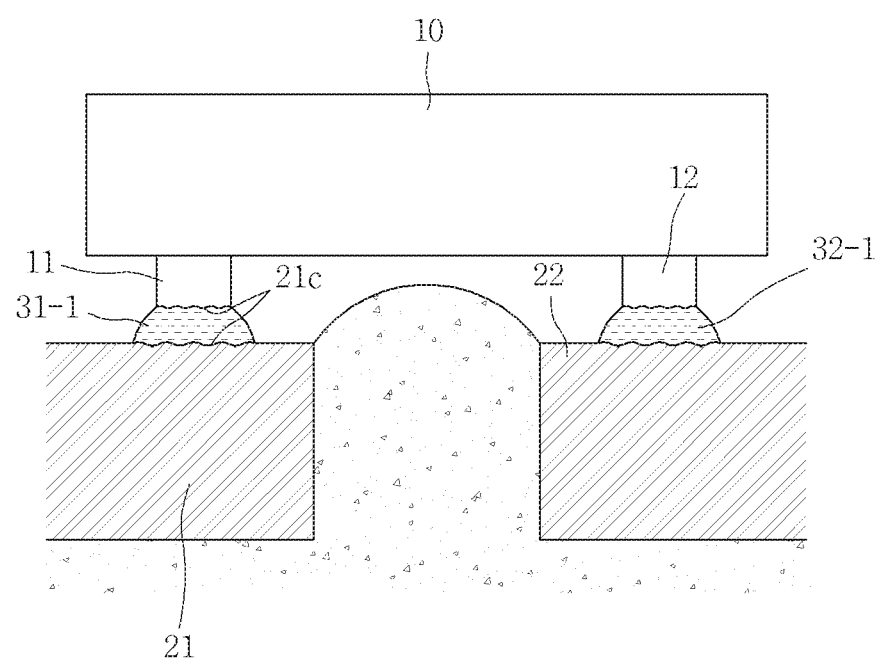
FIG. 23 is an enlarged cross-sectional view illustrating a substrate according to another example of FIG. 1.

FIG. 23 is an enlarged cross-sectional view illustrating a substrate 20 according to yet still another example of FIG. 1.

As illustrated in FIG. 23, the substrate 20 according to yet still another example may have solder cream accommodating rugged surfaces 21c installed thereon.

The solder cream accommodating rugged surfaces 21c may be formed on the first electrode 21 of the substrate 20 so as to have a rough surface by an equipment such as a polishing machine, a surface treating apparatus, a cutter, a press, an etching apparatus, a laser apparatus, or the like.

That is, the first solder creams 31-1 may be installed on the solder cream accommodating rugged surfaces 21c of the first electrode 21 of the substrate to be more firmly adhered, prevent a delamination phenomenon, and be firmly seated at accurate positions without deviating from the solder cream accommodating rugged surfaces 21c or in a state in which they slightly deviate from the solder cream accommodating rugged surfaces 21c.

Although the present invention has been described with reference to exemplary embodiments illustrated in the accompanying drawings, it is only an example. It will be understood by those skilled in the art that various modifications and equivalent other exemplary embodiments are possible from the present invention. Accordingly, the actual technical protection scope of the present invention is to be defined by the following claims.

INDUSTRIAL APPLICABILITY

A mass production property and productivity of a flip-chip light emitting device product may be maximized.

The invention claimed is:

1. A light emitting device package comprising:
a light emitting device including a first terminal and a second terminal;
a substrate including a first electrode formed at one side of an electrode separating space and a second electrode formed at the other side of the electrode separating space;
a first conductive bonding member installed on the first electrode of the substrate so as to be electrically connected to the first terminal of the light emitting device;
a second conductive bonding member installed on the second electrode of the substrate so as to be electrically connected to the second terminal of the light emitting device;
a reflection encapsulant installed on the substrate so as to form a reflection cup part configured to reflect light generated in the light emitting device and filled in the electrode separating space to form an electrode separating part; and
a filler filled between the reflection cup part and the first and second conductive bonding members,
wherein the first terminal of the light emitting device includes:

a reinforcing metal layer installed to be close to the light emitting device and formed of a conductive material having a first elongation percentage; and a buffering metal layer installed beneath the reinforcing metal layer and formed of a conductive material having a second elongation percentage higher than the first elongation percentage.

2. The light emitting device package of claim 1, wherein the reflection encapsulant is formed of a white epoxy molding compound (EMC) or a silicon molding compound (SMC) corresponding to a thermosetting resin having a coefficient of thermal expansion that is in 80% of a coefficient of thermal expansion of the substrate.

3. The light emitting device package of claim 1, wherein the first conductive bonding member is a first solder cream installed on the first electrode of the substrate so as to be electrically connected to the first terminal of the light emitting device and mixed with a liquid-phase solvent to have a dotting viscosity so as to be dotted by a dotting pin, and the second conductive bonding member is a second solder cream installed on the second electrode of the substrate so as to be electrically connected to the second terminal of the light emitting device and mixed with a liquid-phase solvent to have a dotting viscosity so as to be dotted by a dotting pin.

4. The light emitting device package of claim 1, wherein the electrode separating part has a height higher than that of the substrate.

5. The light emitting device package of claim 1, wherein the filler is formed of one or more selected from the group consisting of at least silicon, transparent epoxy, a phosphor, and a combination thereof.

6. The light emitting device package of claim 1, wherein the filler is filled between the first conductive bonding member and the second conductive bonding member by centrifugal force.

7. A backlight unit comprising:
a light emitting device including a first terminal and a second terminal installed therebeneath;
a substrate including a first electrode formed at one side of an electrode separating space and a second electrode formed at the other side of the electrode separating space;
a first conductive bonding member installed on the first electrode of the substrate so as to be electrically connected to the first terminal of the light emitting device;
a second conductive bonding member installed on the second electrode of the substrate so as to be electrically connected to the second terminal of the light emitting device;
a reflection encapsulant installed on the substrate so as to form a reflection cup part reflecting light generated in the light emitting device and filled in the electrode separating space to form an electrode separating part;
a filler filled between the reflection cup part and the first and second conductive bonding members; and
a light guide plate installed in a light path of the light emitting device,
wherein the first terminal of the light emitting device includes:

a reinforcing metal layer installed to be close to the light emitting device and formed of a conductive material having a first elongation percentage; and
a buffering metal layer installed beneath the reinforcing metal layer and formed of a conductive material having a second elongation percentage higher than the first elongation percentage.

8. An illumination apparatus comprising:
a light emitting device including a first terminal and a second terminal installed therebeneath;
a substrate including a first electrode formed at one side of an electrode separating space and a second electrode formed at the other side of the electrode separation space;
a first conductive bonding member installed on the first electrode of the substrate so as to be electrically connected to the first terminal of the light emitting device;
a second conductive bonding member installed on the second electrode of the substrate so as to be electrically connected to the second terminal of the light emitting device;
a reflection encapsulant installed on the substrate so as to form a reflection cup part reflecting light generated in the light emitting device and filled in the electrode separating space to form an electrode separating part; and
a filler filled between the reflection cup part and the first and second conductive bonding members,
wherein the first terminal of the light emitting device includes:
a reinforcing metal layer installed to be close to the light emitting device and formed of a conductive material having a first elongation percentage; and
a buffering metal layer installed beneath the reinforcing metal layer and formed of a conductive material having a second elongation percentage higher than the first elongation percentage.

9. The light emitting device package of claim 1, wherein the reinforcing metal layer is formed of one or more selected from the group consisting of at least silver (Ag), tin (Sn), aluminum (Al), and a combination thereof.

10. The light emitting device package of claim 1, wherein the buffering metal layer contains includes pure gold (Au) having a thickness of 5000 Å or more.

11. The light emitting device package of claim 1, wherein the buffering metal layer includes a thermal stress alleviating protrusion formed thereon or a thermal stress alleviating groove part installed therein.

12. The light emitting device package of claim 1, wherein the buffering metal layer includes a thermal stress alleviating rugged surface formed thereon.

13. The light emitting device package of claim 3, wherein a plurality of first solder creams are simultaneously dotted on a surface of the first electrode of the substrate.

14. The light emitting device package of claim 3, wherein the first solder cream is installed in a solder cream accommodating groove part or a solder cream height limiting protrusion of the first electrode of the substrate.

15. The light emitting device package of claim 3, wherein the first solder cream is installed on a solder cream accommodating rugged surface of the first electrode of the substrate.

* * * * *